United States Patent
McMichael et al.

(10) Patent No.: US 12,055,666 B2
(45) Date of Patent: Aug. 6, 2024

(54) LIDAR SYSTEM

(71) Applicant: Zoox, Inc., Foster City, CA (US)

(72) Inventors: Ryan McMichael, Mountain View, CA (US); Adam Berger, Mountain View, CA (US); Brian Pilnick, East Palo Alto, CA (US); Denis Nikitin, Campbell, CA (US); Riley Andrews, San Francisco, CA (US)

(73) Assignee: Zoox, Inc., Foster City, CA (US)

( * ) Notice: Subject to any disclaimer, the term of this patent is extended or adjusted under 35 U.S.C. 154(b) by 627 days.

(21) Appl. No.: 17/092,787

(22) Filed: Nov. 9, 2020

(65) Prior Publication Data

US 2021/0255287 A1    Aug. 19, 2021

Related U.S. Application Data

(63) Continuation of application No. 15/487,171, filed on Apr. 13, 2017, now Pat. No. 10,830,878.
(Continued)

(51) Int. Cl.
*G01S 7/4865* (2020.01)
*G01S 7/481* (2006.01)
(Continued)

(52) U.S. Cl.
CPC .......... *G01S 7/4865* (2013.01); *G01S 7/4815* (2013.01); *G01S 7/4817* (2013.01); *G01S 7/484* (2013.01);
(Continued)

(58) Field of Classification Search
None
See application file for complete search history.

(56) References Cited

U.S. PATENT DOCUMENTS

| 3,790,277 A | 2/1974 | Hogan |
| 4,154,529 A | 5/1979 | Dyott |

(Continued)

FOREIGN PATENT DOCUMENTS

| CN | 103885065 A | 6/2014 |
| CN | 103926590 B | 7/2014 |

(Continued)

OTHER PUBLICATIONS

U.S. Appl. No. 14/462,075, filed Aug. 18, 2014, Pennecot et al., "Devices and Methods for a Rotating LIDAR Platform with a Shared Transmit/Receive Path," 55 pages.

(Continued)

*Primary Examiner* — Luke D Ratcliffe
(74) *Attorney, Agent, or Firm* — Lee & Hayes, P.C.

(57) ABSTRACT

A LIDAR system emits laser bursts, wherein each burst has at least a pair of pulses. The pulses of each pair are spaced by a time interval having a variable duration to reduce effects of cross-talk. For example, certain embodiments may have multiple emitter/sensor channels that are used sequentially, and each channel may use a different duration for inter-pulse spacing to reduce the effects of cross-talk between channels. The durations may also be varied over time. The emitters and sensors are physically arranged in a two-dimensional array to achieve a relatively fine vertical pitch. The array has staggered rows that are packed using a hexagonal packing arrangement. The channels are used in a sequential order that is selected to maximize spacing between consecutively used channels, further reducing possibilities for inter-channel cross-talk.

20 Claims, 11 Drawing Sheets

Related U.S. Application Data

(60) Provisional application No. 62/440,730, filed on Dec. 30, 2016.

(51) Int. Cl.

| | |
|---|---|
| *G01S 7/484* | (2006.01) |
| *G01S 7/4863* | (2020.01) |
| *G01S 7/487* | (2006.01) |
| *G01S 17/10* | (2020.01) |
| *G01S 17/14* | (2020.01) |
| *G01S 17/42* | (2006.01) |
| *H01L 29/20* | (2006.01) |

(52) U.S. Cl.
CPC ............ *G01S 7/4863* (2013.01); *G01S 7/487* (2013.01); *G01S 17/10* (2013.01); *G01S 17/14* (2020.01); *G01S 17/42* (2013.01); *H01L 29/2003* (2013.01)

(56) References Cited

U.S. PATENT DOCUMENTS

| | | |
|---|---|---|
| 4,516,158 A | 5/1985 | Grainge et al. |
| 4,700,301 A | 10/1987 | Dyke |
| 4,709,195 A | 11/1987 | Hellekson et al. |
| 5,098,185 A | 3/1992 | Watanabe et al. |
| 5,202,742 A | 4/1993 | Frank et al. |
| 5,303,084 A | 4/1994 | Pflibsen et al. |
| 5,337,189 A | 8/1994 | Krawczyk et al. |
| 5,428,438 A | 6/1995 | Komine |
| 5,703,351 A | 12/1997 | Meyers |
| 6,046,800 A | 4/2000 | Ohtomo et al. |
| 6,115,128 A | 9/2000 | Vann |
| 6,778,732 B1 | 8/2004 | Fermann |
| 7,089,114 B1 | 8/2006 | Huang |
| 7,248,342 B1 | 7/2007 | Degnan |
| 7,255,275 B2 | 8/2007 | Gurevich et al. |
| 7,259,838 B2 | 8/2007 | Carlhoff et al. |
| 7,311,000 B2 | 12/2007 | Smith et al. |
| 7,361,948 B2 | 4/2008 | Hirano et al. |
| 7,417,716 B2 | 8/2008 | Nagasaka et al. |
| 7,544,945 B2 | 6/2009 | Tan et al. |
| 7,969,558 B2 | 6/2011 | Hall |
| 8,050,863 B2 | 11/2011 | Trepagnier et al. |
| 8,400,348 B1* | 3/2013 | Guice ................... G01S 13/88 235/404 |
| 8,477,290 B2 | 7/2013 | Yamada |
| 8,675,181 B2 | 3/2014 | Hall |
| 8,742,325 B1 | 6/2014 | Droz et al. |
| 8,767,190 B2 | 7/2014 | Hall |
| 8,836,922 B1* | 9/2014 | Pennecot ............. G01S 7/4815 356/9 |
| 9,086,273 B1 | 7/2015 | Gruver et al. |
| 9,285,464 B2 | 3/2016 | Pennecot et al. |
| 9,368,936 B1 | 6/2016 | Lenius et al. |
| RE46,672 E | 1/2018 | Hall |
| 2002/0140924 A1 | 10/2002 | Wangler et al. |
| 2005/0151828 A1* | 7/2005 | Maeda ..................... B41J 2/451 347/238 |
| 2008/0316463 A1 | 12/2008 | Okada et al. |
| 2010/0020306 A1* | 1/2010 | Hall ..................... H01S 5/0428 356/5.01 |
| 2010/0220141 A1 | 9/2010 | Ozawa |
| 2010/0302528 A1 | 12/2010 | Hall |
| 2011/0216304 A1 | 9/2011 | Hall |
| 2011/0255070 A1 | 10/2011 | Phillips et al. |
| 2013/0050676 A1 | 2/2013 | d'Aligny |
| 2013/0206967 A1* | 8/2013 | Shpunt .................. H01S 3/0071 359/619 |
| 2015/0293228 A1 | 10/2015 | Retterath et al. |
| 2016/0047901 A1 | 2/2016 | Pacala et al. |
| 2017/0016981 A1 | 1/2017 | Hinderling et al. |
| 2017/0219695 A1 | 8/2017 | Hall et al. |
| 2017/0307736 A1* | 10/2017 | Donovan ................ G01S 17/89 |
| 2017/0365984 A1* | 12/2017 | Lipson .................. H01S 5/0237 |
| 2018/0267152 A1 | 9/2018 | McMichael et al. |
| 2018/0301875 A1* | 10/2018 | Burroughs .......... H01S 5/02253 |

FOREIGN PATENT DOCUMENTS

| | | |
|---|---|---|
| CN | 104730535 A | 6/2015 |
| EP | 2410358 A1 | 1/2012 |
| JP | 2016127214 A | 7/2016 |
| JP | 2016534346 A | 11/2016 |
| WO | WO03073123 A1 | 9/2003 |
| WO | WO2009039875 A1 | 4/2009 |
| WO | WO2012172526 A1 | 12/2012 |

OTHER PUBLICATIONS

Efficient Power Conversion, "Why GaN circuits make better Lidar," retrieved on Mar. 3, 2017 at <<http://epc-co.com/epc/DesignSupport/TrainingVideos/eGaNDemos/GaN-circuits-make-better-LiDAR.aspx>> 2 pages.
Notice of Allowance from the U.S. Patent and Trademark Office for U.S. Appl. No. 14/462,075, mailed Nov. 18, 2015. 8 pages.
Non Final Office Action dated Jan. 14, 2020 for U.S. Appl. No. 15/487,171 "LIDAR System," McMichael, 10 pages.
Office Action from the U.S. Patent and Trademark Office U.S. Appl. No. 14/462,075, mailed Jun. 17, 2015. 14 pages.
PCT Search Report and Written Opinion mailed May 16, 2018 for PCT Application No. PCT/US17/68268, 20 pages.
PCT Search Report and Written Opinion mailed Nov. 19, 2014 for PCT Application No. PCT/ US2014/047864, 12 pages.
Rim et al., "The optical advantages of curved focal plane arrays," Optics Express, vol. 16, No. 7, Mar. 31, 2008, 1 page.
Xu et al., "A calibration method of the multi-channel imaging lidar," Proceedings SPIE 9080, Laser Radar Technology and Applications XIX; and Atmospheric Propagation XI, 90800V, Jun. 9, 2014, 2 pages.
European Office Action mailed Sep. 7, 2021 for European Patent Application No. 17829892.3, a foreign counterpart to U.S. Pat. No. 10,830,878, 10 pages.
Japanese Office Action mailed Aug. 17, 2021 for Japanese Patent Application No. 2019-556542, a foreign counterpart to U.S. Pat. No. 10,830,878, 10 pages.
Susumu, "The Analysis of the Transmitted Signal without Erroneous Measurement by Multiple Passes in the Ultrasonic Range Finder", Sep. 22, 2010, 6 pages.
Chinese Office Action mailed Oct. 10, 2022 for Chinese Patent Application No. 201780081889.2, a foreign counterpart to U.S. Pat. No. 10,830,878, 31 pages.
Chinese Office Action mailed Apr. 21, 2023 for Chinese Patent Application No. 201780081889.2, a foreign counterpart to U.S. Pat. No. 10,830,878, 17 pages.
European Office Action mailed Dec. 22, 2023 for European Application No. 17829892.3, 10 pages.

* cited by examiner

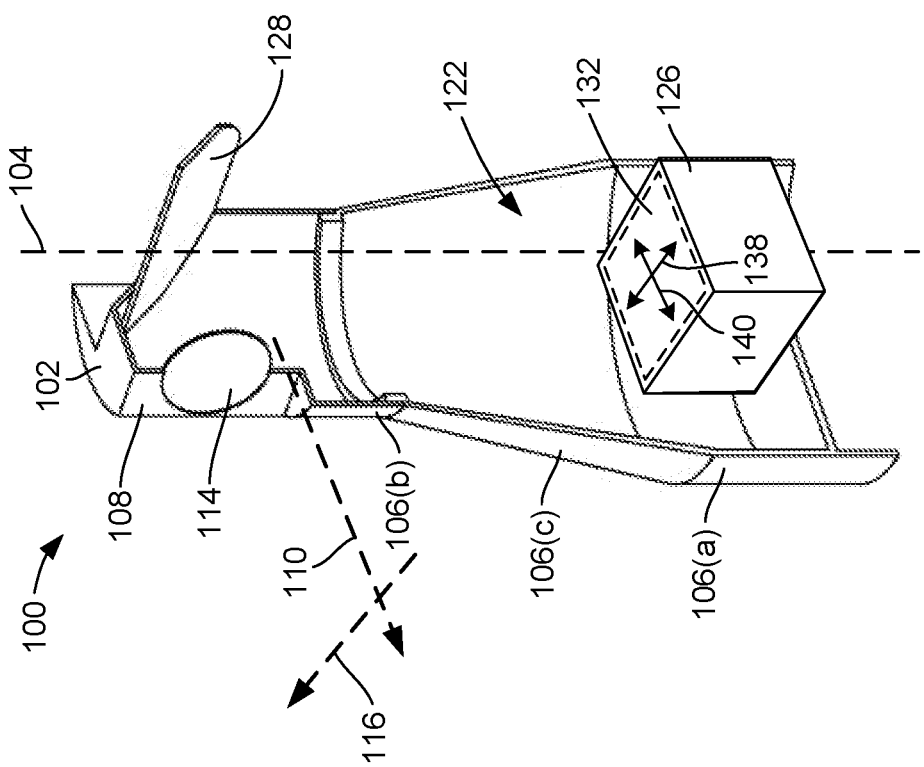
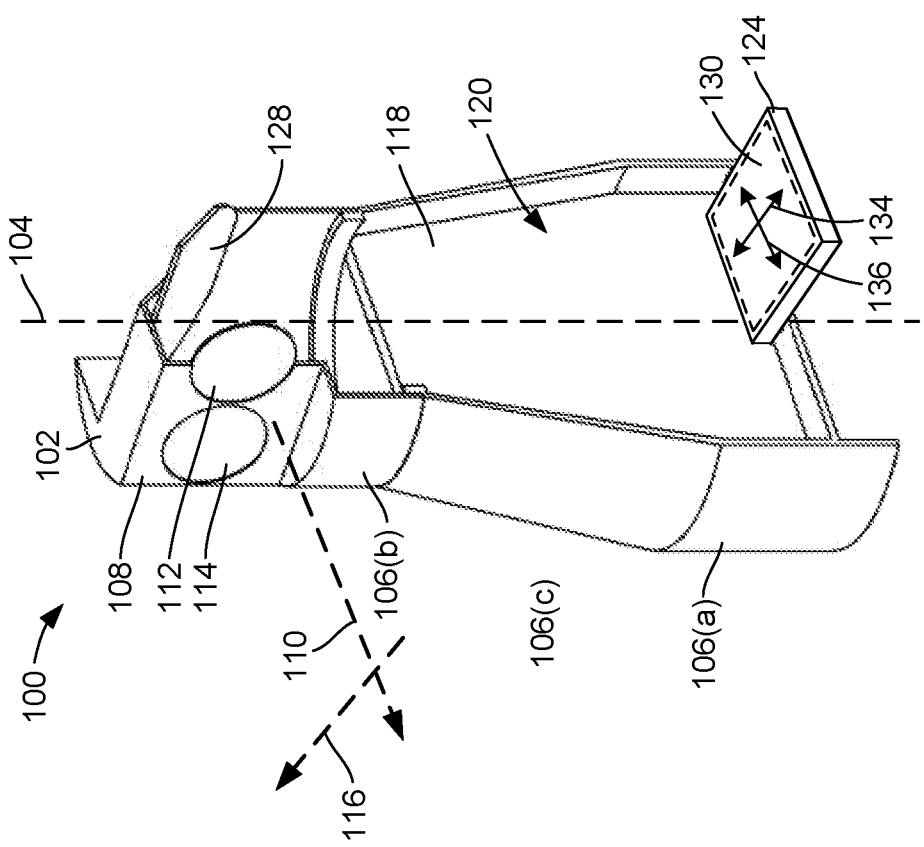

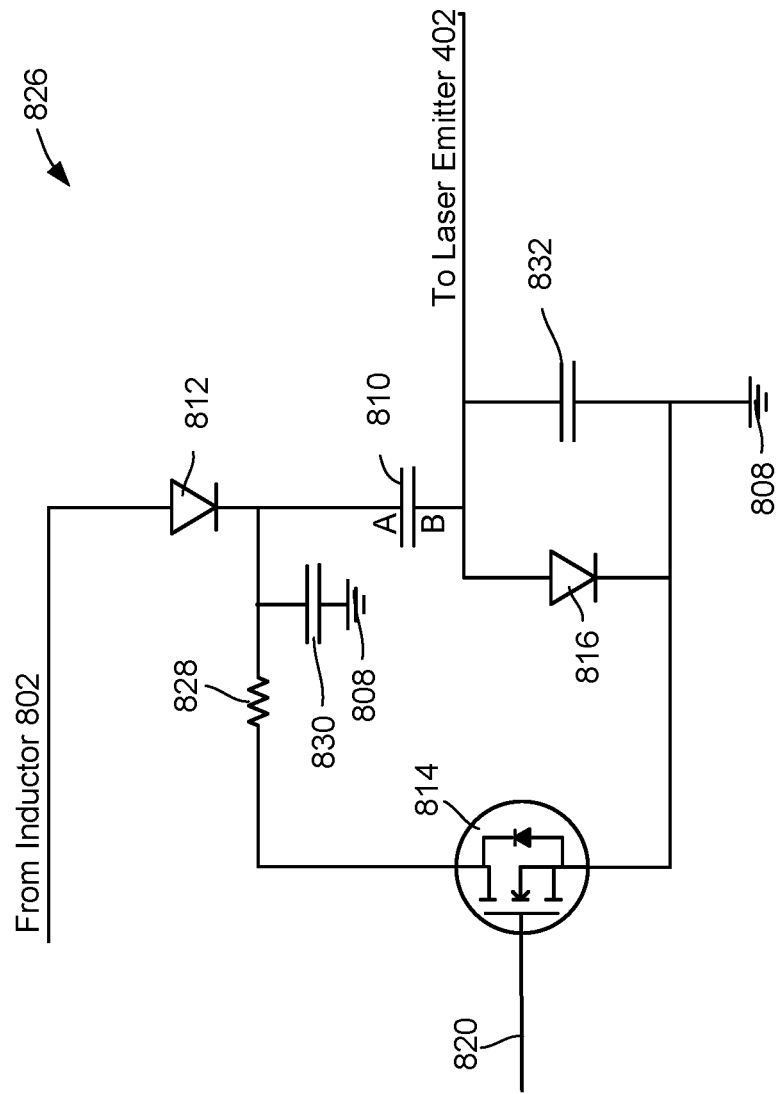

LIDAR SYSTEM

CROSS-REFERENCE TO RELATED APPLICATION

This application is a continuation of and claims priority to U.S. patent application Ser. No. 15/487,171, filed on Apr. 13, 2017, which claims priority to U.S. Provisional Patent Application No. 62/440,730 filed on Dec. 30, 2016, and titled "LIDAR SYSTEM," which is herein incorporated by reference in its entirety.

BACKGROUND

The term "LIDAR" refers to a technique for measuring distances of visible surfaces by emitting light and measuring properties of the reflections of the light. The term is a combination of parts of the words "light" and "radar," although the term is often thought of as an acronym for "Light Detection and Ranging." As used herein, the term "LIDAR" refers to a distance measuring technique that is based on determining the propagation time of light between a measuring device and one or more target points.

A LIDAR system typically has at least one light emitter and a corresponding light sensor. The light emitter may comprise a laser such as an injection laser diode (ILD) that directs highly coherent light in the direction of an object or surface. The light sensor may comprise a photodetector such as a photomultiplier or avalanche photodiode (APD) that converts light intensity to a corresponding electrical signal. Optical elements such as lenses or mirrors may be used in the light transmission and reception paths to focus and direct light.

A LIDAR system has signal processing components that analyze reflected light signals to determine the distances to surfaces from which the emitted laser light has been reflected. For example, the system may measure the propagation time of a light signal as it travels from the laser emitter, to the surface, and back to the light sensor. A distance is then calculated based on the flight time and the known speed of light.

Some LIDAR devices can measure the distances of multiple surface points within a scene. For each surface point, the LIDAR system can determine both the distance of the surface point and its angular direction with respect to the device. This capability can be used to create a point cloud comprising three-dimensional coordinates of the multiple surface points.

In order to measure coordinates of multiple surface points, a LIDAR system may use multiple laser emitters and/or multiple light sensors. Alternatively, a LIDAR system may physically move one or more lasers and/or detectors to scan over a scene while repeatedly taking measurements of different surface points.

LIDAR systems have been used to inform guidance, navigation, and control systems in autonomous vehicles. In systems such as this, one or more LIDAR devices are configured to produce a surface map indicating the 3D coordinates of visible surface points surrounding the vehicle. A guidance, navigation, and control system analyzes this data to identify obstacles, to perform obstacle avoidance, and to determine a desired path of travel.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

FIGS. 1A and 1B are sectional perspective views of an example rotational LIDAR assembly.

FIG. 8B is a schematic view of a trigger circuit that may be used in a measurement channel to fire a laser emitter.

DETAILED DESCRIPTION

Figure 3:
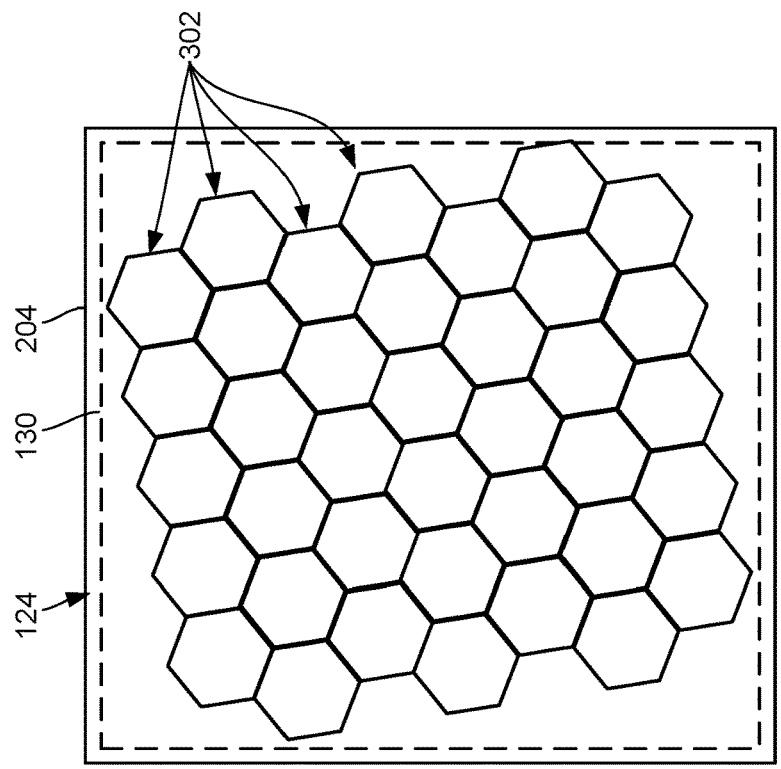
FIG. 3 is a representational top view of the example light sensor, illustrating an example packing arrangement.

An apparatus and associated techniques are described herein for determining real-time coordinates of visible surfaces that are within a scene. The apparatus and techniques can be used in various types of vision systems to produce point clouds indicating the three-dimensional (3D) coordinates of surfaces that are visible from the perspective of the apparatus. As an example, the apparatus and techniques may be used by guidance, navigation, and control systems of autonomous vehicles such automobiles, aircraft, boats, etc. The apparatus and techniques may also be used in other applications that have a need for real-time, multi-point, scanning distance measurements, such as, for example, robots, manned vehicles, and computer vision systems.

The apparatus comprises a rotatable chassis that houses components for implementing a LIDAR distance measurement system. In the described embodiment, the chassis rotates about a vertical rotational axis to scan horizontally across a scene, although the chassis may be aligned non-vertically in other embodiments.

The apparatus has one or more lenses that define an overall field of view of a scene surrounding the apparatus. As the chassis rotates, the field of view moves or scans across a scene.

The apparatus has multiple laser emitters positioned within the chassis to project laser light outward through the one or more lenses. The apparatus also has multiple light sensor elements so that light from any particular emitter is reflected through the one or more lenses to a corresponding sensor element. For purposes of discussion, the term "channel" is used herein to refer to an individual laser emitter, corresponding sensor element, and the circuitry associated with the emitter and sensor element.

In some examples, the laser emitters and sensor elements may have similar or identical physical arrangements or layouts with respect to the overall field of view of the apparatus. For example, the sensor elements may be arranged within a sensor image frame having an x axis, which is the axis along which the scene is scanned as the chassis rotates, and an orthogonal y axis. In the illustrated embodiments in which the rotational axis is vertically aligned, the x axis corresponds to the horizontal axis of the scene and the y axis corresponds to the vertical axis of the scene.

In some examples, the sensor elements are arranged as a series of staggered rows that are tilted slightly from the x axis. The two-dimensional nature of this layout allows the photodiodes to have an effective resolution, corresponding to a y-axis pitch, that is smaller than the diameter of the sensor components themselves and smaller than would be possible with a linear arrangement.

In some examples, the amount of tilt from the x axis is selected so that the sensor elements have a uniform spacing or pitch relative to the y axis of the sensor image frame. In other examples, they-axis spacing of the lasers and/or sensor elements may be non-uniform.

In some examples, the laser emitters are arranged similarly within an emitter image frame. The emitter image frame has an x axis, also referred to herein as a scan axis, that corresponds to the x axis of the sensor frame. The emitter image frame has a y axis that corresponds to the y axis of the sensor frame. The one or more lenses direct light produced by the emitters from the emitter image frame outwardly into the field of view of the one or more lenses.

The one or more lenses are configured so that light from a laser emitter at a particular x-y position relative to the emitter frame is directed outwardly in a corresponding direction. Received light from that same direction is directed inwardly by the one or more lenses to the corresponding sensor element, which is at the same x-y position relative to the sensor frame.

In the illustrated examples, the sensor elements are mounted on a single, planar printed circuit board. The laser emitters, however, are mounted on multiple printed circuit boards. Each emitter board supports a corresponding row of the laser emitters, and the laser emitters are mounted on edges of the boards to point toward the one or more lenses. The edges of the emitter boards are curved, and the emitter boards are inclined inwardly with respect to each other so that the laser emitters are all equidistant from a lens entrance pupil and are also all directed to converge at the lens entrance pupil.

The measurement channels are used individually and in sequence to perform individual distance measurements. For each distance measurement, a laser emitter of a channel emits one or more pulses and a return reflection is sensed by the sensor element of the channel. The sensor element creates a return signal representing the intensity of the reflected light over time.

In the described embodiments, the laser emitter of the channel emits a burst of one or more closely spaced pulses. When the emitted burst hits an object and is reflected, the return signal comprises a burst of pulses, similar in shape to the emitted pulses, that is delayed with respect to the emitted burst. The time delay between the emitted burst and the returned burst is then calculated. In one embodiment, a cross-correlation is performed between the return signal and a reference signal to determine the time delay. The highest peak of the auto-correlation is identified, and the timing of the highest peak is taken as indicating the round-trip propagation time of the emitted burst. A distance is then calculated based on the propagation time.

In one embodiment, the pulses are temporally spaced from each other by a time interval whose duration may be varied over time and between channels to reduce the impact of cross-talk. Cross-talk may occur, for example, when a sensor element receives a reflection of light that was emitted by an emitter of a different channel, or when a sensor elements receives light that was emitted from another LIDAR apparatus. Varying the pulse spacing reduces ambiguity between different light emissions, so that the cross-correlation inherently tends to mask out reflected bursts whose spacings are different than the spacing of the originally emitted burst. The spacing can be varied across the different channels and also may be varied over time for an individual channel. For example, the pulse spacing for each channel may be changed randomly for every rotation of the chassis.

In some embodiments, the magnitudes of the pulses may be varied within bursts and/or across bursts, in addition to or as an alternative to varying the spacings between the pulses, and cross-correlation may be used to determine the time delay between the emitted bursts and the corresponding return bursts.

In certain embodiments, the channels are used in a predefined order, at a rate such that each channel measurement is initiated during the maximum expected flight time of a laser burst emitted by a previous channel. Thus, two (or potentially more) laser bursts may be "in flight" at any given time.

Two ADCs (analog to digital converters) are used in the illustrated example to digitize signals produced by the photodiodes. The ADCs are used in an alternating sequence, so that a particular ADC digitizes every other laser emission. For example, the reflection from a first laser burst is digitized by a first ADC, the reflection from a second laser burst is digitized by a second ADC, the reflection from a third laser burst is digitized by the first ADC, the reflection from a fourth laser burst is digitized by the second ADC and so on. Two ADCs may be used in embodiments where two laser bursts may be in flight at any given time. In other examples, in which multiple lasers bursts may be in flight concurrently, additional ADCs may be used.

Each laser emitter may be associated with a pair of capacitors that are used to generate two energy pulses for a corresponding individual laser burst. The capacitors of each pair are charged in common by a regular boost circuit, and discharged separately into the corresponding laser emitter using a pair of FETs (field-effect transistors). In certain embodiments, these FETs may comprise enhancement-mode GaN (gallium nitride) FETs, also referred to as eGaN FETs. In embodiments in which laser bursts include more than two pulses, more than two capacitors may be used to provide multiple energy bursts to fire a laser emitter multiple times.

The channels are divided into multiple charging banks. In described embodiments, the channels are divided into two charging banks. The capacitors corresponding to the laser emitters of one charging bank are charged while the laser emitters of the other charging bank are being fired. This allows a first bank of the channels to be used at a high rate, while allowing for the much lower rate at which the capacitors of each channel can be charged.

The channel order is selected to maximize the physical distance between consecutively-fired laser emitters, in order to further minimize potential for inter-channel cross-talk. The channel order is subject to constraints that (a) consecutively-fired channels are associated with different ADCs and (b) the order should repeatedly specify first all the channels of the first charging bank and then all the channels of the second charging bank. Note that each charging bank includes channels of both ADC groups.

FIGS. 1A and 1B illustrate an example configuration of a rotatable sensor assembly 100 that may be used as part of a LIDAR sensor device or system.

The sensor assembly 100 comprises a chassis 102 that rotates about a rotational axis 104. In certain embodiments, the rotational axis is vertical. In other embodiments, the rotational axis may be tilted from vertical or may be in any orientation that is suitable for the particular environment in which the sensor assembly 100 is being used.

The chassis 102 has an outer contour that is generally symmetrical about the rotational axis 104. The chassis 102 has a lower section 106(a) having a cylindrical outer contour, an upper section 106(b) having a cylindrical outer contour, and a middle section 106(c) having an outer contour that forms a conical frustum between the larger diameter of the lower section 106(a) and the smaller diameter of the upper section 106(b).

The upper section 106(b) has a cutout forming a flat surface 108 that faces in a forward direction 110, also referred to as the z direction, relative to the chassis 102. The flat surface 108 has one or more openings to accommodate first and second lenses 112 and 114. The first and second lenses 112 and 114 are mounted so that their optical axes are generally perpendicular to the rotational axis 104, and generally parallel to the forward direction 110. In practice, each of the first and second lenses 112 and 114 may have three individual lens elements, or any other number of lens elements. In some embodiments, the first and second lenses 112 and 114 may overlap each other, with the overlapping portions being unused.

The first and second lenses 112 and 114 have a common field of view of a scene. Rotation of the chassis 102 causes the field of view to move or scan in a scan direction 116, also referred as the x direction, over the scene. In the illustrated embodiment, in which the rotational axis 104 is vertical, the scan direction 116 is horizontal.

The chassis 102 has a partially bisecting internal wall 118 that forms a compartment on each of two lateral sides of the chassis 102. In FIG. 1A, a sensor compartment 120 is shown on one side of the chassis 102. In FIG. 1B, an emitter compartment 122 is shown on the other side of the chassis 102. The sensor compartment 120 houses a light sensor 124. The emitter compartment 122 houses a laser light source 126.

The first lens 112 is generally above the sensor compartment 120 and forward of the light sensor 124. The second lens 114 is generally above the emitter compartment 122 and forward of the laser light source 126.

One or more mirrors 128 are positioned within the chassis 102 behind the first and second lenses 112 and 114 to redirect emitted and received light between horizontal and vertical directions. Received light enters the chassis generally horizontally from the first lens 112 and is redirected downwardly by the one or more mirrors 128 toward the light sensor 124. The laser light source 126 emits laser light in an upward direction. The emitted light hits the one or more mirrors 128 and is redirected horizontally outward, in the forward direction 110 through the second lens 114.

The first lens 112 projects an image onto a sensor frame 130 of the light sensor 124. The sensor frame 130 is an area having an x axis 134 that corresponds optically to the scan direction 116. As the chassis 102 rotates, an image of the scene scans along the x axis 134 of the sensor frame 130. Accordingly, the x axis of the sensor frame 130 may at times be referred to as the scan axis of the sensor frame 130. In the illustrated orientation in which the rotational axis 104 is vertical, the x axis 134 corresponds optically to the horizontal direction of the projected image.

The sensor frame 130 has a y axis 136 that is perpendicular to the x axis. In the illustrated orientation in which the rotational axis 104 is vertical, the y axis 136 of the sensor frame 130 corresponds optically to the vertical direction of the projected image.

Laser emitters within an emitter frame 132 of the light source 126 project laser light through the second lens 114 into the scene. The emitter frame 132 has an x axis 138, also referred to as a scan axis, that corresponds optically to the scan direction 116. As the chassis 102 rotates, the projected light scans in the scan direction 116. The emitter frame 132 has a y axis 140 that is perpendicular to the x axis 138. In the illustrated orientation in which the rotational axis 104 is vertical, the x axis 138 of the emitter frame 132 corresponds optically to the horizontal direction of the scene into which the laser light is projected. The y axis 140 of the emitter frame 132 corresponds optically to the vertical direction of the scene into which the laser light is projected.

Generally, the laser light source 126 has one or multiple laser emitters and the light sensor 124 has one or multiple corresponding sensor elements. Each laser emitter corresponds to a respective sensor element, and a pair comprising an emitter and a corresponding sensor element is referred to as a channel. The term "channel" may also encompass supporting circuitry that is associated with the emitter/sensor pair. A channel is used to emit a laser light burst and to measure properties of the reflections of the burst, as explained below.

The examples described herein include 38 measurement channels, and accordingly comprise 38 laser emitters and 38 respectively corresponding light sensors. Different embodiments may use different numbers of channels depending on desired sensor resolutions and coverage angles, where the coverage angle corresponds to the field of view relative to the horizon.

Figure 2:
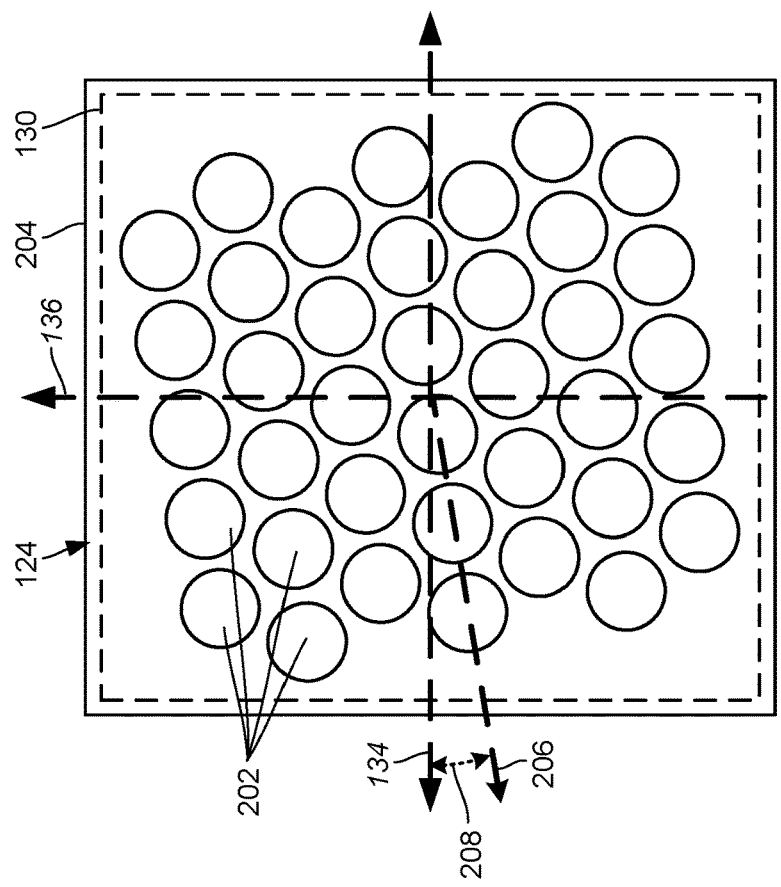
FIG. 2 is a representational top view of an example light sensor that may be used in the LIDAR assembly of FIGS. 1A and 1B.

FIG. 2 illustrates further details regarding the light sensor 124. The light sensor 124 comprises an array of individual sensor elements 202. In certain embodiments, the sensor elements 202 comprise avalanche photodiodes (APDs).

The sensor elements 202 are mounted on a planar printed circuit board 204. The sensor elements 202 are positioned within the sensor frame 130, which is an area within which the first lens 112 projects an image of an external scene. FIG. 2 shows the x axis 134, which is the axis corresponding to the scan direction 116 of the chassis 102 relative to the scene. The x axis 134, also referred to herein as the scan axis, represents the axis along which an image of the scene is translated as the chassis 102 rotates.

The sensor elements 202 are arranged in multiple parallel rows, with alternate rows being staggered to achieve a higher packing density. Each row extends along a line that is angled with respect to the x axis 134 so that each sensor element 202 is at a different elevation relative to the y axis 136, where the y axis 136 is orthogonal to the scan axis 134.

FIG. 2 shows a line 206 along which one row of sensor elements 202 extends. The line 206 is at an angle 208 relative to the x axis 134. At the illustrated row pitch, the angle 208 results in each sensor element 202 having a unique y-axis position or elevation. In addition, the sensor elements 202 have a uniform y-axis pitch.

FIG. 3 illustrates further details regarding how the sensor elements 202 are packed to achieve a relatively high packing density and correspondingly fine y-axis pitch. In FIG. 3, an area associated with each sensor element 202 is illustrated as a hexagon 302, and the hexagons 302 are packed so that they are immediately adjacent to each other. This is known as hexagonal packing. Each hexagon 302 represents an area that is occupied by a sensor element 202 and any associated circuitry that may be located near the sensor element 202.

In one embodiment, each sensor element and its associated circuitry occupies an area allowing for a 6 millimeter sensor-to-sensor pitch. At this sensor-to-sensor pitch and using a lens having a focal length of 106 millimeters, the angle 208 is 0.5 degrees. This produces a y-axis pitch of 0.86 millimeters. The illustrated arrangement may be varied, such as by varying the number of sensor elements 202 and varying the angle 208 for a desired y-axis distribution. In addition, although the illustrated arrangement fits roughly within a square or circle, other arrangements may be used, including non-symmetrical arrangements.

Figure 4:
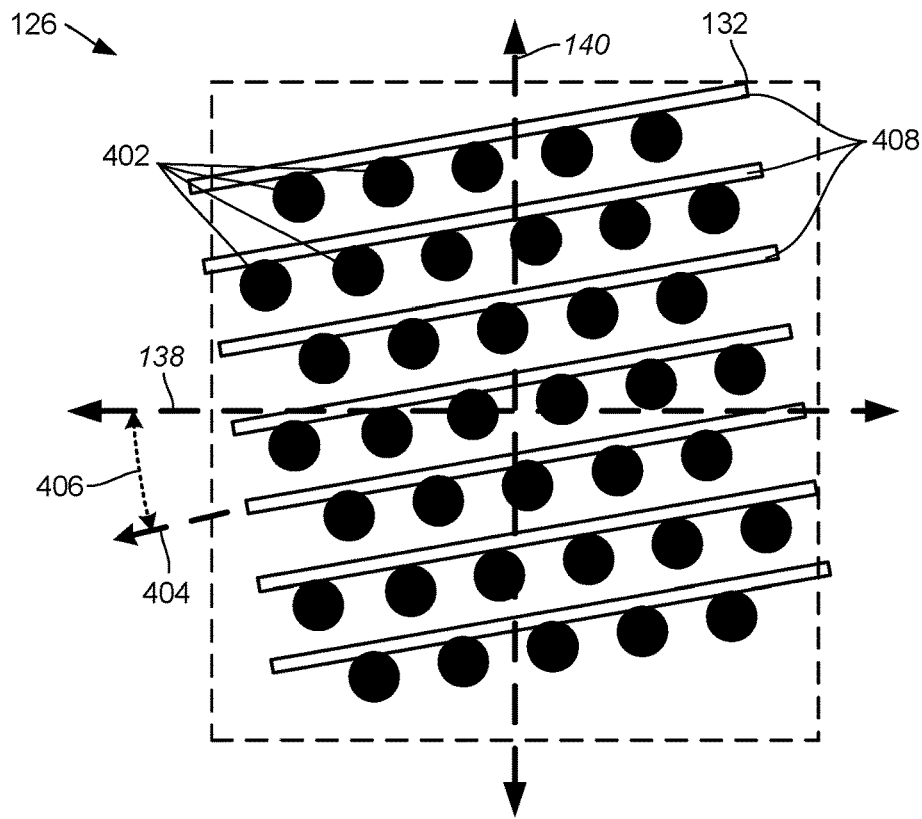
FIG. 4 is a representational top view of an example laser light source that may be used in the LIDAR assembly of FIGS. 1A and 1B.

FIG. 4 illustrates details regarding an example embodiment of the laser light source 126. The laser light source 126 comprises a plurality of individual laser emitters 402, arranged the same as the sensors of FIG. 2. In the described embodiment, the laser emitters 402 comprise injection laser diodes (ILDs).

The laser emitters 402 are positioned within the emitter frame 132, which is an area from which the second lens 114 projects. FIG. 4 shows the x axis 138, which is the axis corresponding to the scan direction 116 of the chassis 102 relative to the scene.

The laser emitters 402 are arranged in multiple parallel rows, with alternate rows being staggered to achieve a higher packing density. Each row extends along a line that is angled with respect to the x axis 138 so that each laser emitter 402 is at a different elevation relative to they axis 140, where they axis 140 is orthogonal to the scan axis 138.

FIG. 4 shows a line 404 along which one row of laser emitters 402 extends. The line 404 is at an angle 406 relative to the x axis 138. At the illustrated row pitch, the angle 406 results in each laser emitter 402 having a unique y-axis position or elevation. In addition, the laser emitters 402 have a uniform y-axis pitch.

In this example, the laser emitters 402 are arranged with the same spacings as the sensor elements 202, and the angle 406 is equal to the angle 208. However, in other examples the spacings and/or offset angle of the laser emitters 402 may be different than those used for the sensor elements 202.

The laser emitters 402 are mounted along edges of printed circuit boards 408, also referred to as emitter boards 408, with each emitter board 408 being used to position a corresponding row of the laser emitters 402.

In certain embodiments, a fast axis collimator (FAC) lens (not shown) is positioned in front of each laser emitter 402 in order to reduce divergence of the fast axis of the emitter 402 and to match the divergence of the fast axis to the etendue of the sensor assembly 100. This tends to improve throughput and reduce astigmatism, thereby improving image quality.

Figure 5:
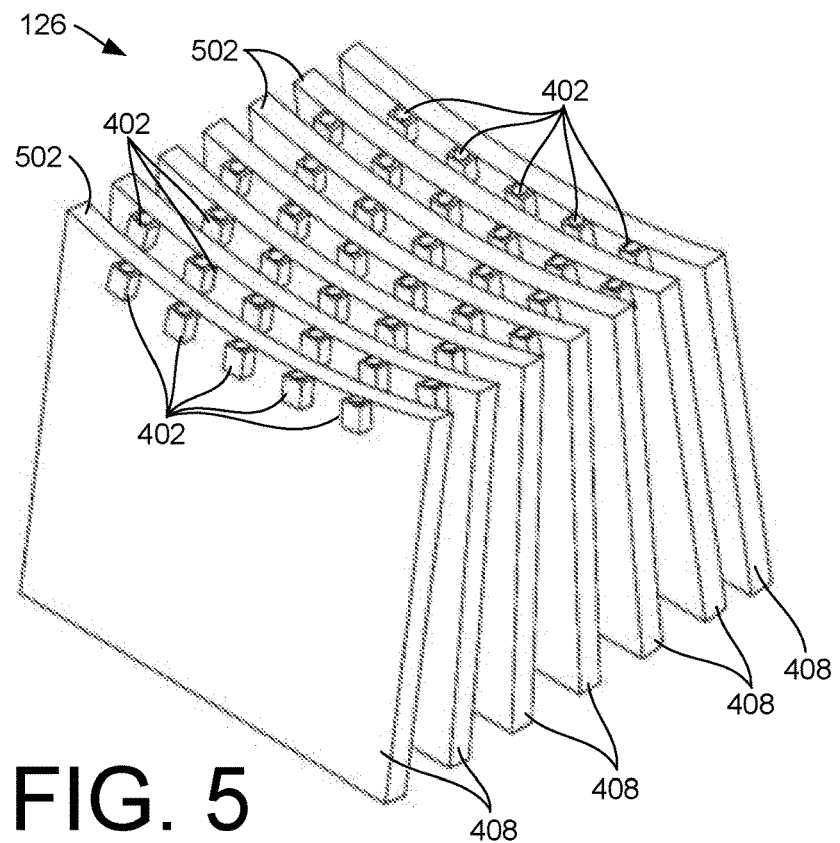
FIG. 5 is a perspective view of an example laser light source that may be used in the LIDAR assembly of FIGS. 1A and 1B.

FIG. 5 shows further details of the laser light source 126 and the emitter boards 408. As illustrated, the laser emitters 402 are mounted along upper edges 502 of the emitter boards 408. The emitter boards 408 and the upper edges 502 are configured to position the laser emitters 402 along an imaginary sphere, so that all the laser emitters 402 are optically equidistant from the entrance pupil of the second lens 114.

More specifically, each upper edge 502 has a concave curve with a radius equal to the optical distance between the laser emitters 402 and the entrance pupil of the second lens 114. The boards 408 are inclined inwardly with respect to each other in order to direct the laser emitters 402 toward the lens entrance pupil. Each laser emitter 402 is aligned perpendicularly to the curved upper edge 502 so that emitted laser light converges at the entrance pupil of the second lens 114. This alignment simplifies the design of the second lens 114. In particular, this ensures consistency between every channel so that in many cases there may be no need for (a) channel specific calibration and/or (b) complex lens structures to account for different path lengths.

In other embodiments, the laser emitters 402 may be positioned in a single plane, while still being aligned to emit light to converge at the entrance pupil of the second lens 114.

As mentioned above, a measurement channel comprises a laser emitter 402, a sensor element 202 at an optically corresponding position, and associated circuitry. In operation, the measurement channels are activated or used sequentially to determine distances of scene points. To perform a distance measurement, a laser emitter 402 of a channel is activated to produce a short burst of light pulses. The burst is reflected from a surface point of the scene and is received by the corresponding sensor element 202 of the channel. The time relationship of the received burst to the emitted burst is then analyzed to determine the distance between the assembly 100 and the surface point, in a process that will be described in more detail below. The channels are used in a specific, predetermined order to accommodate charging, to accommodate the shared use of a limited number of ADC (analog-to-digital) components, and to minimize possibilities for cross-talk between channels.

Figure 6:
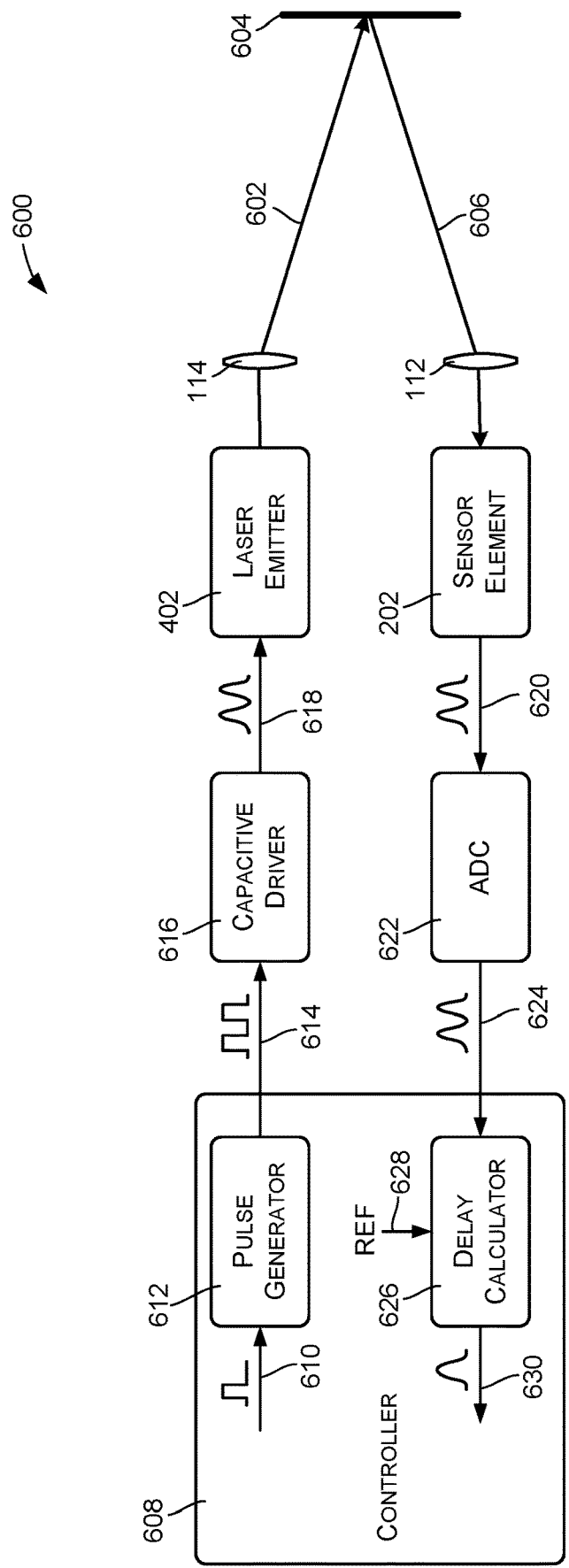
FIG. 6 is a block diagram illustrating high-level components that may, in some examples, be used in conjunction with a LIDAR measurement channel.

FIG. 6 illustrates logical elements of a LIDAR distance measurement system 600 that may be used to perform distance or ranging measurements using or in conjunction with a laser/sensor arrangement such as described above. FIG. 6 shows shared control components as well as elements that are dedicated to a single measurement channel.

A measurement channel includes one of the laser emitters 402 and a corresponding one of the sensor elements 202. For a single distance measurement, the laser emitter 402 is controlled to emit a burst of laser light pulses through the second lens 114 along an outward path 602. The burst is reflected by a surface 604 of a scene, through the lens 112, and to the sensor element 202 along a return path 606.

The second lens 114 is designed so that beams from laser emitters 402 at different physical positions within the emitter frame 132 are directed outwardly at different angles. Specifically, the second lens 114 is designed to direct light from the laser emitter 402 of a particular channel in a corresponding and unique direction. The first lens 112 is designed so that the corresponding sensor element 202 of the channel receives reflected light from the same direction.

The system 600 has a controller 608 that implements control and analysis logic for multiple channels. The controller 608 may be implemented in part by an FPGA (field-programmable gate array), a microprocessor, a DSP (digital signal processor), or a combination of one or more of these and other control and processing elements, and may have associated memory for storing associated programs and data.

To initiate a single distance measurement using a single channel, the controller 608 generates a trigger signal 610. The trigger signal 610 is received by a pulse generator 612. In response to receiving the trigger signal 610, the pulse generator 612 generates a burst signal 614. The burst signal 614 comprises a pair of sequential pulses that indicate the times at which the laser emitter 402 should be activated or turned on. Activating or turning on the emitter may be referred to as "firing" the emitter. Each emitter is fired to create a light pulse having a short duration.

In certain embodiments, the rising edges of the pulses may be used to indicate the times at which the laser emitter 402 should be activated or turned on. As illustrated in FIG. 6, the function of the pulse generator 612 may in actual implementation be performed by the controller 608.

The burst signal 614 is received by a capacitive driver 616. The capacitive driver 616 in response provides an emitter drive signal 618. The emitter drive signal 618 comprises a pair of sequential energy pulses, corresponding in time to the pulses of the burst signal 614. The emitter drive signal 618 is connected to the laser emitter 402 to fire the laser emitter 402 and to produce pulses of laser light.

Assuming that the emitted laser light is reflected from the surface 604, the sensor element 202 receives the reflected light and produces a return signal 620. The return signal 620 is generally of the same shape as the emitter drive signal 618, although it may differ to some extent as a result of noise, interference, cross-talk between different emitter/sensor pairs, interfering signals from other LIDAR devices, and so forth. The return signal 620 will also be delayed with respect to the emitter drive signal 618 by an amount corresponding to the round-trip propagation time of the emitted laser burst.

An ADC (analog-to-digital converter) 622 receives and digitizes the return signal 620 to produce a digitized return signal 624. The digitized return signal 624 is a stream of digital values indicating the magnitude of the return signal 620 over time. Note that the ADC 622 is a shared component, and is used to digitize signals provided by multiple different sensor elements 202 at different times.

A delay calculator 626 receives the digitized return signal 624 and calculates the phase difference or time shift between the light pulses as emitted from the laser emitter 402 and as received at the sensor element 202. In the described embodiment, the delay calculator comprises a cross-correlation component, also referred to herein as a cross-correlator 626, that performs a cross-correlation between the digitized return signal 624 and a reference waveform 628, to produce a cross-correlation signal 630. Other methods of determining the phase difference, such as direct peak-to-peak measurements, may be used in other embodiments. As illustrated in FIG. 6, the function of the delay calculator 626 may be performed by the controller 608.

The reference waveform 628 represents the timing and the intensity of the light that is actually emitted by the laser emitter 402. In certain embodiments, the reference waveform 628 may be obtained during a calibration cycle. For example, in some embodiments there may be a reference surface at which the output of the laser emitter can be aimed. The reference surface may in some cases comprise part of the support structure of the chassis 102, and may be at a known, relatively small distance from the first and second lenses 112 and 114. When the output of the laser emitter 402 is directed toward the reference surface, the capacitive driver 616 drives the laser emitter 402 to produce an output burst. The sensor element 202 and the ADC 622 are then used to capture a waveform corresponding to the light reflected from the reference surface. This captured waveform may be used as the reference waveform 628. The reference waveform 628 may be captured uniquely for each channel, may be stored and used for multiple subsequent measurements, and may be updated over time to account for thermal drift and/or other variables. In some embodiments, the reference waveform 628 may be updated at least once per revolution of the chassis.

In other embodiments, one or more different sensors, inside or outside the chassis 102, may be used to capture the reference waveform 628 during one or more calibration emissions of the laser emitter 402. Furthermore, multiple readings may be performed and averaged to create the reference waveform 628.

The controller 608 receives the cross-correlation signal 630 and analyses the cross-correlation signal 630 to find its highest peak, which indicates the phase difference or time shift between the light pulses as emitted from the laser emitter 402 and as received at the sensor element 202.

Note that FIG. 6 shows logical components and signals in a simplified manner for purposes of describing general characteristics. In actual implementation, various different types of signals may be generated and used in order to fire the laser emitter 402 and to measure the phase difference between the output of the laser emitter and the reflected light that is sensed by the sensor element 202.

Figure 7:
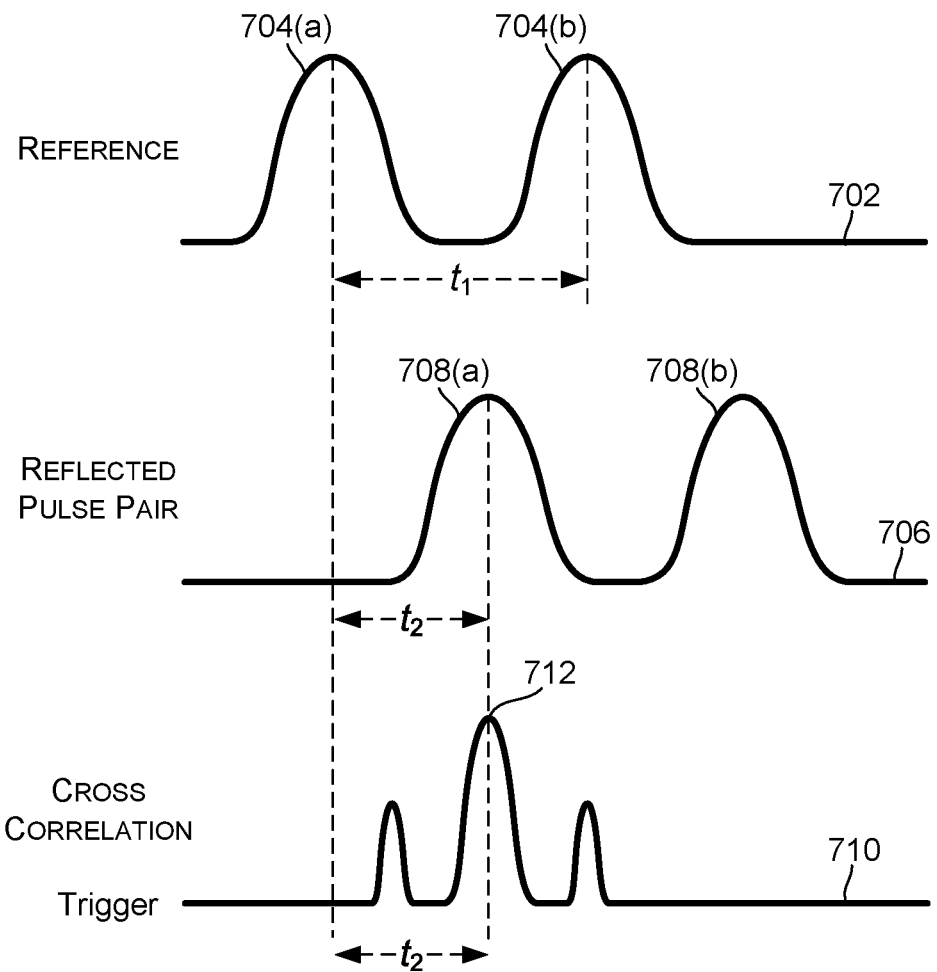
FIG. 7 is a graph illustrating example waveforms that may be generated or received in a LIDAR measurement channel.

FIG. 7 illustrates further general characteristics of the emitted light pulses, the reflected light pulses, and the cross-correlation between the emitted light pulses and the reflected light pulses. FIG. 7 shows a first waveform 702 representing the timing and intensity of light emitted by a laser emitter 402, such as may be indicated by the reference waveform 628 of FIG. 6. The light for a single distance measurement is emitted as a sequence or burst of multiple pulses, in this example comprising a pair of pulses 704(a) and 704(b), each having a width of approximately 5 to 50 nanoseconds. However, in other examples, sequences or bursts of pulses having more than two pulses of longer or shorter duration can be used. In the illustrated example, the pulses of the pair are spaced from each other by a time interval having a duration $t_1$. In one embodiment, each pulse has a time interval duration that varies between 20 and 50 nanoseconds. The pulses are generated by the discharge of capacitors through the laser emitter, and therefore have Gaussian shapes.

The time interval duration $t_1$ by which the pulses 704 are spaced is different for different generated bursts, and is established by the controller 608. For example, bursts produced by different channels may use different time interval durations, and the durations may be changed for every rotation of the chassis 102. In some cases, a time interval duration, used for inter-pulse spacing, may be randomly selected and assigned for each channel, and for each rotation of the chassis 102. This can reduce talk between channels and between other LIDAR devices.

FIG. 7 shows a second waveform 706 representing the magnitude of the reflected light received and detected by the sensor element 202, such as may be indicated by the return signal 620 of FIG. 6. The second waveform 706 has a pair of pulses 708(*a*) and 708(*b*) corresponding respectively to the pulses 704(*a*) and 704(*b*). The pulses of the second waveform 706, however, are delayed by a time $t_2$ relative to the first waveform 702. The timing relationship between the pulses of the second waveform 706 should be the same as that of the emitted pulses 704.

FIG. 7 shows a third waveform 710 representing the cross correlation between the first waveform 702 and the second waveform 706, such as may be indicated by the cross-correlation signal 630 of FIG. 6. The highest peak 712 of the third waveform 710 corresponds in time to $t_2$, which is the phase difference between the first waveform 702 and the second waveform 706.

In the case of cross-talk, such as a return light signal that is from a different channel, the variable and/or random spacing of the emitted pulses means that the return signal will likely have a different pulse spacing and will not be strongly correlated by the cross-correlation as represented by the third waveform 710. This tends to reduce the impact of any cross-talk between channels and/or between different LIDAR devices.

Figure 8A:
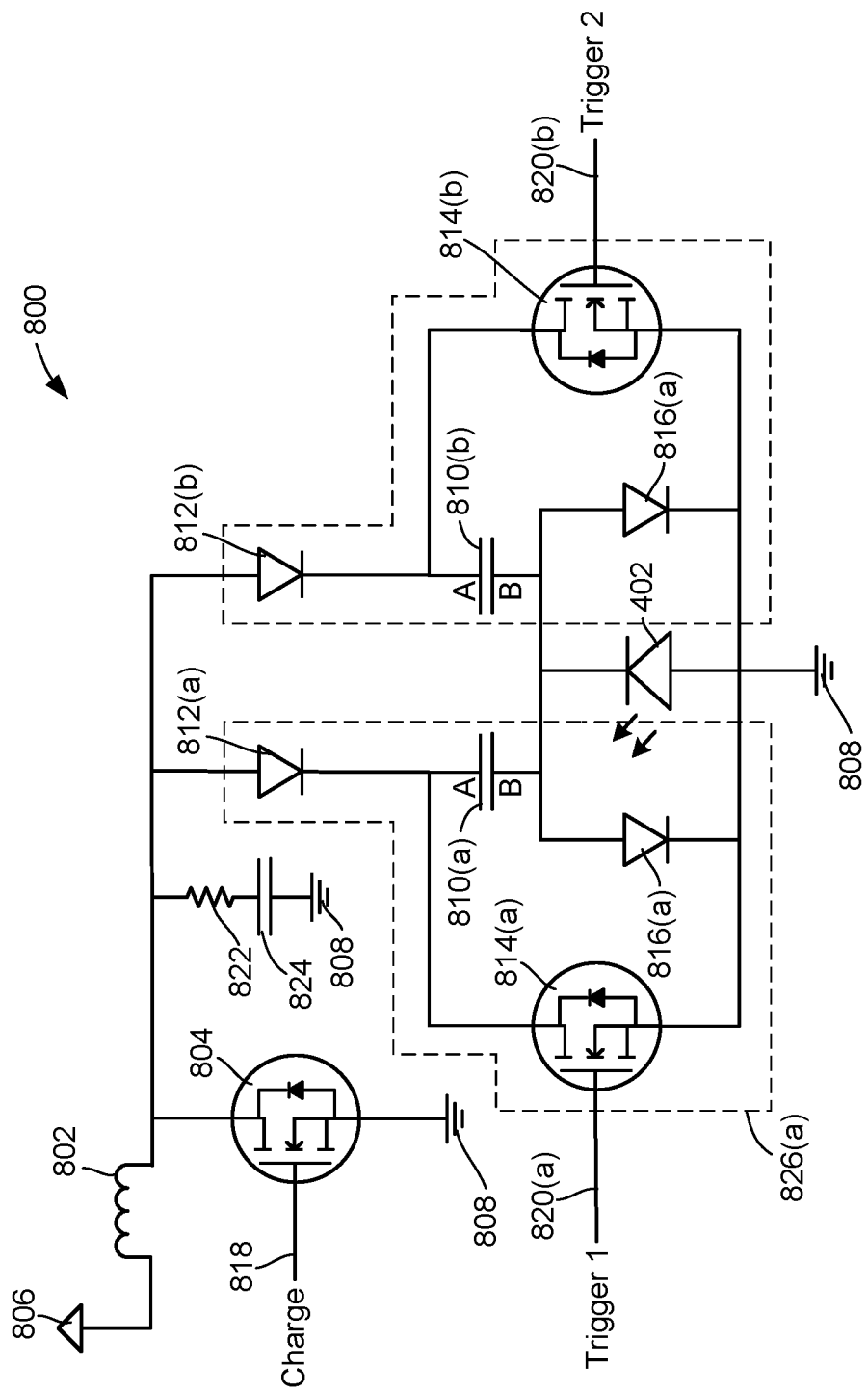
FIG. 8A is a schematic view of an example electrical circuit that may be used in a measurement channel to generate a pair of laser pulses.

FIG. 8A shows an example electrical circuit 800 for driving an individual laser emitter 402, and in particular for firing on the laser emitter 402 in a burst of two short pulses. In this example, the laser emitter 402 comprises an injection laser diode having an anode and a cathode. Each measurement channel has an instance of the circuit 800. Note that although the circuit 800 in this example is configured to produce two pulses, the circuit 800 can be expanded to produce any number of pulses, and may also be modified to produce only a single pulse.

The circuit 800 has an inductive boost charging section comprising an inductor 802 and a transistor 804. In certain embodiments, the transistor 804 comprises an FET (field-effect transistor) or enhanced-mode GaN FET (gallium nitride field-effect transistor), referred to as an eGaN FET. A first terminal of the inductor 802 is connected to a power source 806, which has a positive voltage relative to a ground reference 808. For example, the power source 806 may be a 5-volt DC (direct-current) voltage source. The second terminal of the inductor is connected to the drain of the transistor 804. The source of the transistor 804 is connected to the ground reference 808.

The circuit 800 has first and second energy storage capacitors 810(*a*) and 810(*b*), which may in some embodiments comprise non-polarized ceramic capacitors. For purposes of discussion, each of these capacitors is labeled as having an "A" terminal and a "B" terminal. During operation of the circuit, the A terminal is charged positively relative to the B terminal.

The energy storage capacitors 810(*a*) and 810(*b*) are connected through corresponding blocking diodes 812(*a*) and 812(*b*) to the second terminal of the inductor 802, to be charged with current supplied by the inductor 802. Specifically, the anodes of the blocking diodes 812(*a*) and 812(*b*) are connected to the second terminal of the inductor 802. The cathode of the blocking diode 812(*a*) is connected to the A terminal of the first energy storage capacitor 810(*a*). The cathode of the blocking diode 812(*b*) is connected to the A terminal of the second energy storage capacitor 810(*b*).

The B terminals of the capacitors 810(*a*) and 810(*b*) are connected in common to the cathode of the laser emitter 402.

Note that in some cases, the capacitance represented by each of the capacitors 810(*a*) and 810(*b*) may be provided by multiple capacitors in parallel.

First and second transistors 814(*a*) and 814(*b*) are associated respectively with the first and second energy storage capacitors 810(*a*) and 810(*b*). In the described embodiment, each of the transistors 814(*a*) and 814(*b*) comprises an FET, and in some embodiments may comprise a GaN FET. The drain of the first transistor 814(*a*) is connected to the A terminal of the first energy storage capacitor 810(*a*). The drain of the second transistor 814(*b*) is connected to the A terminal of the second energy storage capacitor 810(*b*). The sources of the first and second transistors 814(*a*) and 814(*b*) are connected to the ground reference 808. The anode of the laser emitter 402 is also connected to the ground reference 808.

The circuit 800 may also have one or more flyback diodes 816. The anode of each flyback diode 816 is connected to the cathode of the laser emitter 402. The cathode of each flyback diode 816 is connected to the anode of the laser emitter 402 and to the ground reference 808. The flyback diodes limit the negative voltage that can be induced at the anode of the laser emitter 402.

In operation, the gate of the transistor 804 is connected to a charge signal 818. When the charge signal 818 turns on the transistor 804, current flows from the power source 806, through the inductor 802, through the transistor 804, and to the ground reference 808.

When the current through the inductor 802 is nearly to the saturation point of the inductor 802, the transistor 804 is turned off, and the inductor current then flows to the capacitors 810 and positively charges the A terminals relative to the B terminals. The relative voltage to which the capacitors 810 are charged will be referred to herein as the charge voltage.

In the described embodiments, the transistor 804 is turned on for approximately 2 microseconds. When the transistor 804 is turned off, it takes approximately 500 nanoseconds for the capacitors 810 to charge. The total charging time is thus 2.5 microseconds or greater.

The gate of the first transistor 814(*a*) is connected to a first trigger signal 820(*a*), which is used to turn on the first transistor 814(*a*) when the laser emitter 402 is to emit a first pulse. Turning on the first transistor 814(*a*) lowers the voltage at the A terminal nearly to the voltage of the ground reference 808, and accordingly also lowers the voltage of the B terminal by an amount approximately equal to the charge voltage. Accordingly, the cathode of the laser emitter 402 will now be at a negative potential with respect to the anode, and the stored energy of the capacitor is discharged through the laser emitter 402. The resulting current through the laser emitter 402 causes the laser emitter 402 to emit light.

The gate of the second transistor 814(*b*) is connected to a second trigger signal 820(*b*). The second trigger signal 820(*b*) is used to discharge the second capacitor 810(*b*) through the laser emitter 402 in order to create a second pulse.

In operation, the first transistor 814(*a*) is turned on to initiate the first pulse of a laser burst, and the second transistor 814(*b*) is turned on shortly after to initiate the second pulse.

Although the circuit 800 is shown as using n-type or enhancement mode GaN FETs for the transistors 814, a similar circuit using p-type or depletion mode GaN FETs may also be used. In addition, the circuit can be expanded to support generation of any number of pulses, for use to sequentially fire any number of laser emitters.

In some embodiments, a snubber can be added to reduce voltage oscillations in drive current that might otherwise occur due to parasitic capacitances and inductances. If such oscillations were allowed to occur, it could become necessary to wait until they were to subside before firing the laser emitter 402. A snubber may comprise a resistor 822 and a capacitor 824 connected in series between the second terminal of the inductor 802 and the ground reference 808 to damp any voltage and current oscillations at the second terminal of the inductor 802.

The circuit 800 can be modified to produce any number of laser pulses, including a single pulse or more than two pulses. Dashed lines are used in FIG. 8A to indicate components of first and second firing circuits 826(*a*) and 826(*b*). These firing circuits can be replicated as needed to create any number of pulses. To create a single drive pulse, a single firing circuit 826 may be used. To create three drive pulses, three firing circuits 826 may be used, each connected to the inductor 802 and the emitter 402 as shown in FIG. 8A.

FIG. 8B illustrates additional elements that may be used in some embodiments of a firing circuit 826 such as shown in FIG. 8A.

Parasitic capacitances and inductances associated with the transistor 814 and its associated components and interconnections may in certain situations limit the shortness of the pulse generated by the firing circuit 826, and it may be desired to produce a shorter pulse than would otherwise be possible. In these situations, a relatively small resistance 828 may be placed in series between the A terminal of the energy storage capacitor 810 and the drain of the transistor 814. In combination with parasitic capacitances and inductances, the resistance 828 creates a resonance such that the voltage at the A terminal of the capacitor 810 oscillates to produce an initial current pulse that is shorter than would otherwise occur. In some embodiments, a capacitance 830 may also be added between the A terminal of the capacitor 810 and the ground reference 808 to enhance or further tune this effect. In some embodiments, a capacitance 832 may similarly be added between the B terminal of the capacitor 810 and the ground reference 808 to further enhance this effect. The values of the added resistances and capacitances are calculated or determined based on the characteristics of the specific implementation in order to achieve a desired initial pulse duration.

In some cases, the transistor 814 may be duplicated, so that two such transistors are used in parallel to drive the current from the energy storage capacitor 810. Using two transistors in parallel may reduce the effects of parasitic inductances and capacitances.

Figure 9:
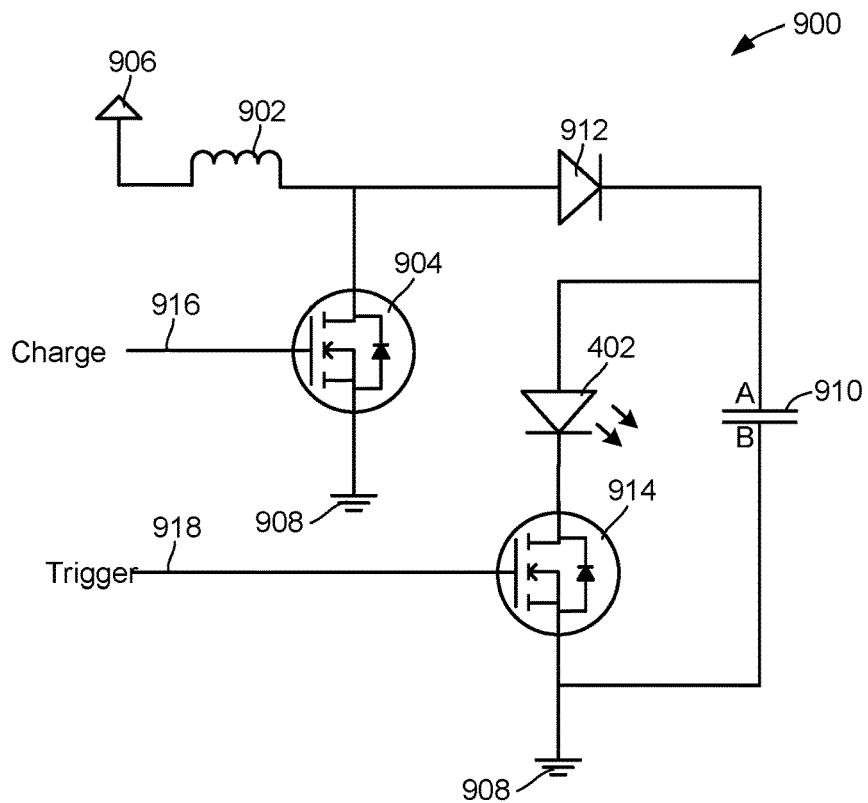
FIG. 9 is a schematic view of an example electrical circuit that may be used in a measurement channel to generate a single laser pulse.

FIG. 9 shows another example electrical circuit 900 for driving the laser emitter 402. In this example, however, the circuit 900 provides only a single emitted light pulse, rather than multiple pulses. A circuit such as this may be used in embodiments in which each distance measurement is performed using a single laser pulse rather than a multi-pulse burst.

The circuit 900 has an inductive boost charging section comprising an inductor 902 and a transistor 904. The transistor 904 may comprise a FET or an eGaN FET. A first terminal of the inductor 902 is connected to a power source 906, which has a positive voltage relative to a ground reference 908. For example, the power source 906 may be a 5-volt DC (direct-current) voltage source. The second terminal of the inductor is connected to the drain of the transistor 904. The source of the transistor 904 is connected to the ground reference 908.

The electrical circuit 900 has an energy storage capacitor 910. The energy storage capacitor 910 is labeled as having an "A" and a "B" terminal. During operation of the circuit, the A terminal is charged positively relative to the B terminal.

The energy storage capacitor 910 is connected through a diode 912 to the second terminal of the inductor 902, to be charged with current supplied by the inductor 902. Specifically, the anode of the diode 912 is connected to the second terminal of the inductor 902. The cathode of the diode 912 is connected to the A terminal of the energy storage capacitor 910. The B terminal of the capacitor 910 is connected to the ground reference 908.

The anode of the laser emitter 402 is connected to the A terminal of the energy storage capacitor 910. A transistor 914 is connected between the cathode of the laser emitter 402 and the ground reference 908. Specifically, the drain of the transistor 914 is connected to the cathode of the laser emitter 402 and the drain of the transistor is connected to the ground reference 908.

In operation, the gate of the transistor 904 is connected to a charge signal 916. When the charge signal 916 turns on the transistor 904, current flows from the power source 906, through the inductor 902, through the transistor 904, and to the ground reference 908.

When the current through the inductor 902 is nearly to the saturation point of the inductor 902, the transistor 904 is turned off, and the inductor current then flows to the capacitor 910, charging the A terminal relative to the B terminal.

The gate of the transistor 914 is connected to a trigger signal 918, which is used to turn on the transistor 914 at the appropriate time for emitting a pulse from the laser emitter 402. Turning on the transistor 914 causes the energy stored by the energy storage capacitor 910 to discharge through the laser emitter 402.

The transistor 914 comprises an n-type enhancement mode GaN FET in this embodiment, although a similar circuit may be implemented for use with a p-type depletion mode GaN FET, or with any other type of FET.

Figure 10:
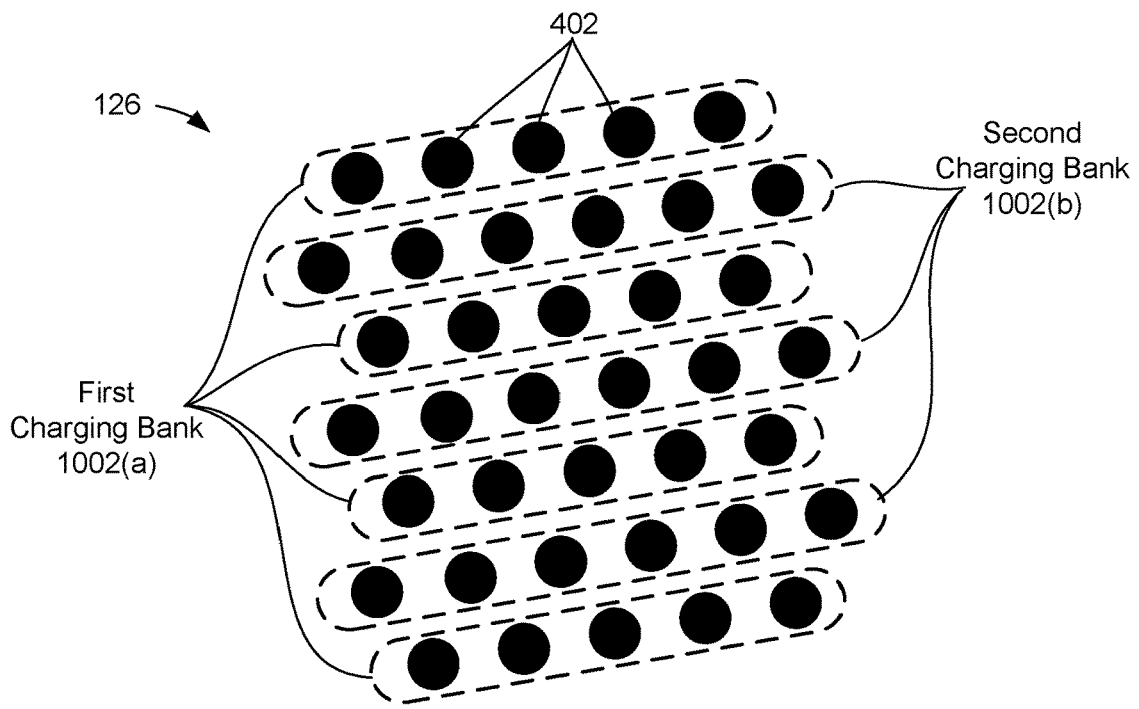
FIG. 10 is a representative view of an example array of laser emitters and their association with different charging banks.

FIG. 10 illustrates the concept of charging banks. In certain embodiments, the measurement channels are segregated into or assigned to different charging banks. The described embodiment uses two charging banks, although different embodiments may use different numbers of charging banks.

In the described embodiment, each channel is assigned to one or the other of two charging banks. Charging of the capacitors associated with all of the emitters of a single charging bank is performed concurrently. Charging is performed in repeated cycles of first charging the capacitors associated with emitters of the first charging bank and subsequently charging the capacitors associated with emitters of the second charging bank. While a bank is being charged, the channels of the other bank are used for distance measurements.

In the illustrated embodiment, alternate rows of the channels (represented by the laser emitters 402 of the channels in FIG. 10) are assigned to first and second charging banks 1002(*a*) and 1002(*b*), respectively. In the illustrated example, from top to bottom, the first, third, fifth, and seventh rows belong to the first charging bank 1002(*a*). The second, fourth, and sixth rows belong to the second charging bank 1002(*b*).

During operation, the storage capacitors 810 associated with the laser emitters 402 of the first charging bank 1002(*a*) are charged concurrently while storage capacitors 810 associated with the laser emitters 402 of the second charging bank 1002(*b*) are used to create laser pulses. Subsequently, the storage capacitors 810 associated with the laser emitters 402 of the second charging bank 1002(b) are charged concurrently while the storage capacitors 810 associated with the laser emitters 402 of the first charging bank 1002(a) are used to create laser pulses. This sequence is repeated continuously, with one bank being charged while the other is being fired.

Figure 11:
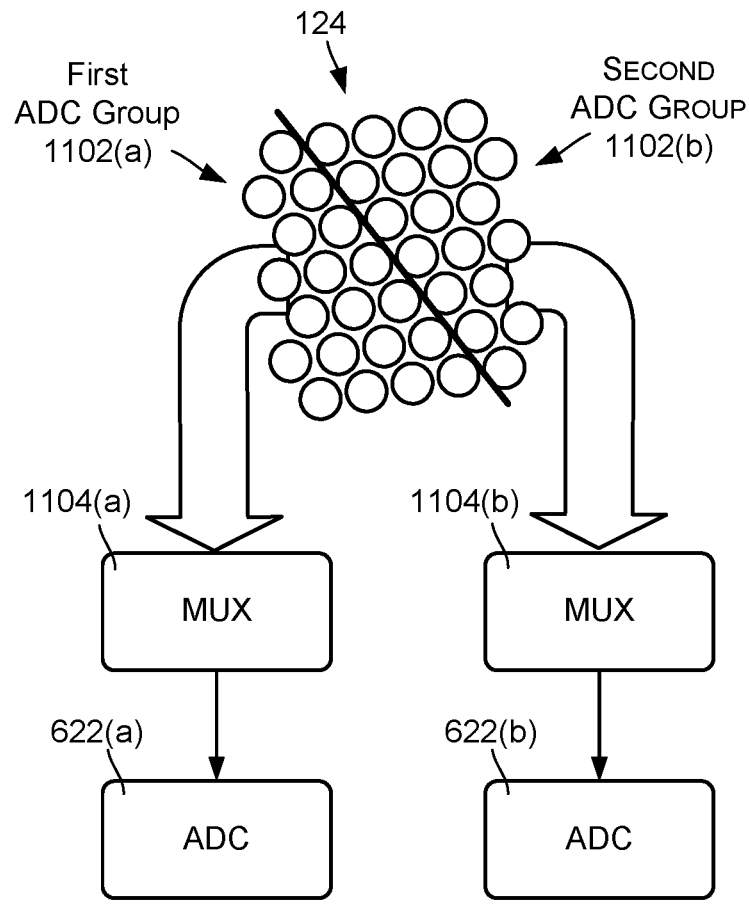
FIG. 11 is a block diagram illustrating an example array of sensor elements and their association with different ADC (analog-to-digital converter) groups.

FIG. 11 illustrates the concept of ADC groups. In the described embodiment, two ADCs are used to digitize signals produced by 38 sensor elements of the light sensor 124. In order to accomplish this, the signals from half of the sensor elements, which are referred to as a first ADC group 1102(a), are multiplexed to a first ADC 622(a). The signals from the other half of the sensor elements, which are referred to as a second ADC group 1102(b), are multiplexed to a second ADC 622(b). In this example, the first ADC group 1102(a) comprises sensor elements on the left side (as illustrated) of the light sensor 124 and the second ADC group 1102(b) comprises sensor elements on the right side (as illustrated) of the light sensor 124. The first ADC group 1102(a) thus includes channels corresponding to channels of both the first charging bank 1002(a) and the second charging bank 1002(b). Similarly, the second ADC group 1102(b) includes channels corresponding to channels of both the first charging bank 1002(a) and the second charging bank 1002(b). Note that different mappings of channels to ADC groups may be used in various embodiments.

In some embodiments, laser emitters that produce light at different wavelengths may be used in order to reduce crosstalk between consecutively used channels. For example, some of the laser emitters may emit light at a 905 nanometers and others of the laser emitters may emit light at 1064 nanometers. The laser emitters of the difference wavelengths can then be used alternately, so that the emitted light alternates between 905 nanometers and 1064 nanometers. The light sensors can be similarly configured to be sensitive to the respective wavelengths and to filter other wavelengths.

Figure 12:
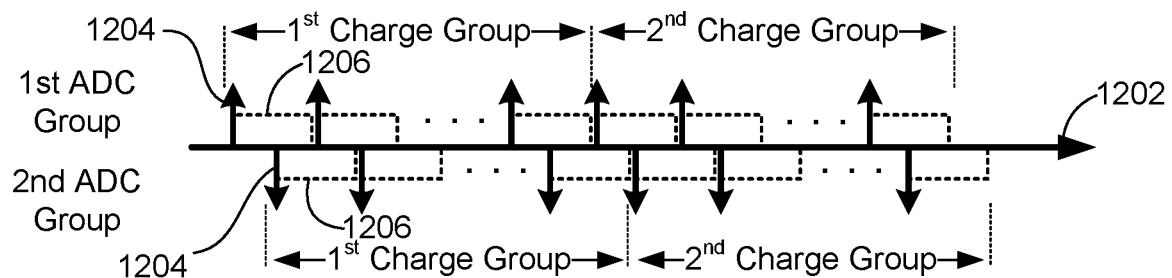
FIG. 12 is a graph illustrating an example measurement channel sequence.

FIG. 12 illustrates an example of how the differently positioned measurement channels may be used in a predefined sequence that accommodates the existence of both charging banks and ADC groups.

A horizontal timeline 1202 is illustrated, along which time increases from left to right. Vertical arrows 1204 are used to indicate laser bursts from different channels. FIG. 12 illustrates a single cycle in which all of the channels are activated once, in an ordered sequence. The cycle is repeated continuously during operation of the device.

Each upward arrow 1204 represents a burst from a channel of the first ADC group 1102(a). Each downward arrow 1204 represents a burst from a channel of the second ADC group 1102(b). As shown, the ordered sequence specifies channels that are alternatively from the first ADC group and the second ADC group.

Each burst is followed by an observation period, indicated by a dashed rectangular area 1206. The observation period is the maximum expected propagation time of an emitted burst as it travels outward and is reflected back inward toward the device, during which the sensor element is monitored for a reflection. In the described embodiment, the observation period is approximately 1 millisecond, which is sufficient time for an emitted light pulse to propagate to and return from a surface that is up to 140 meters away.

FIG. 12 illustrates that the channels are used at a rate that results in overlapping observation periods 1206. This means that up to two laser bursts, created by respective measurement channels, may be "in flight" at any given time. The two ADCs 622(a) and 622(b) are used to sense reflected light during these overlapping observation periods.

When a channel of the first ADC group emits a laser burst, the sensor element of the channel is connected through the multiplexer 1104(a) to the first ADC 622(a), and the first ADC 622(a) is used to digitize the signal generated by the sensor element. This connection is maintained through the following observation period 1206. During this observation period, however, a channel of the second ADC group emits another laser burst. This second laser burst is followed by a corresponding observation period during which the sensor element of the second ADC group channel is connected through the multiplexer 1104(b) to the second ADC 622(b).

To summarize, the laser bursts occur at a rate such that two laser bursts may be in-flight at any given time. The first ADC 622(a) is used to digitize the return signal from one of the in-flight laser bursts and the second ADC 622(b) is used to digitize the return signal from the other of the in-flight laser bursts. When a third burst is emitted, the first ADC 622(a) is used to digitize the return signal from the third in-flight laser burst.

FIG. 12 illustrates that the ordered sequence comprises, first, all channels of the first charging bank 1002(a), followed by all channels of the second charging bank 1002(b).

Figure 13:
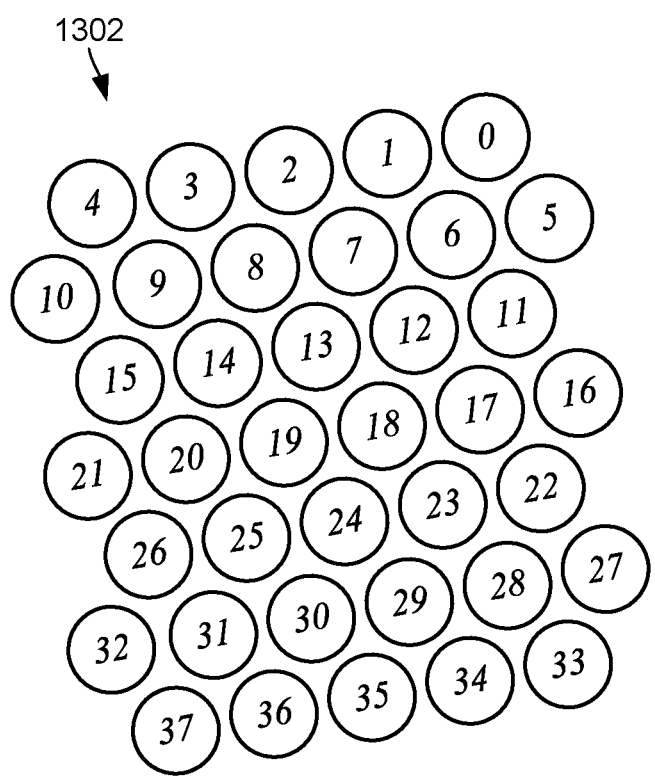
FIG. 13 is a representative view of an example array of measurement channels, used to illustrate a channel order.

FIG. 13 illustrates a specific example of an ordered sequence of channels in the context of the channel arrangement described above. Generally, it is desirable to select a channel order that provides at least a minimum degree of physical spacing between consecutively used channels. This is because there is some chance that a burst emitted by one channel may be received and detected by a closely adjacent channel.

Accordingly, increasing the physical distance between consecutively used channels decreases the potential for cross-talk between channels. However, the channel order is also constrained by the nature of the ADC groups and the charging banks. Specifically, the channel order is subject to constraints that (a) consecutively used channels need to be from different ADC groups and (b) the order must group together all of the channels of the first charging bank, followed by all of the channels of the second charging bank.

FIG. 13 shows the layout of multiple channels 1302, using the arrangement already described. The channels are labeled using numerals 0-37, in order from top to bottom. For example, channel 0 is the upper-most channel, channel 1 is the next lower channel, and so on, continuing to the lower-most channel 37.

Subject to the constraints set forth above, the following firing order is optimized to achieve at least a minimum spacing between consecutively used channels:

20-16-29-7-32-28-19-6-10-27-31-18-9-5-30-8-21-17-25-11-34-3-26-12-4-33-24-2-37-23-15-1-36-22-14-0-35-13

In this example, the minimum spacing is 3. That is, consecutively fired channels are at least three positions from each other. In other examples using different numbers and/or configurations of lasers and detectors, the minimum spacing may be greater or less than 3.

Figure 14:
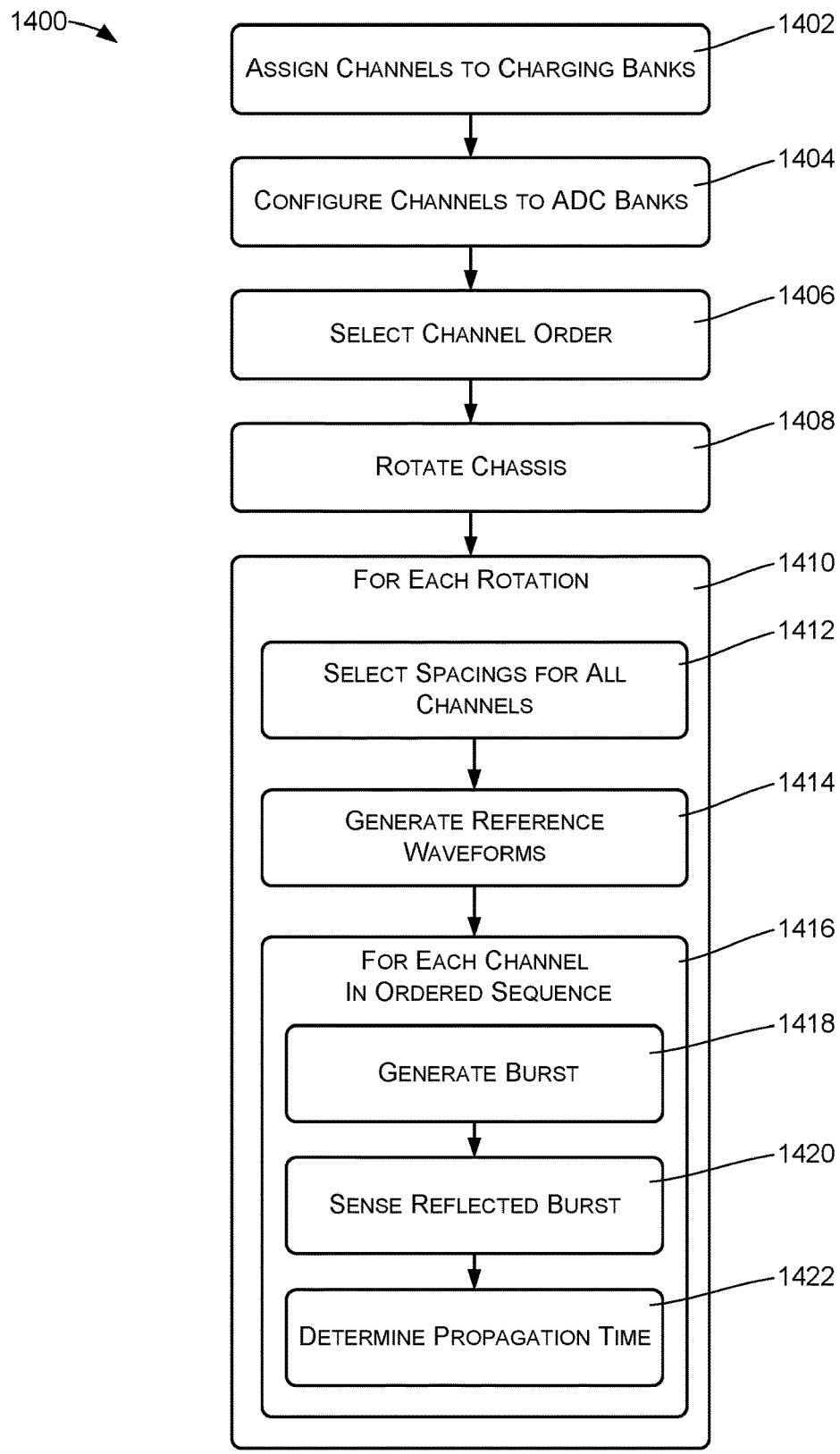
FIG. 14 is a flow diagram illustrating an example method of performing distance measurements.

FIG. 14 shows an example method 1400 that will be described as being performed in an environment having multiple LIDAR measurement channels, which are used to perform respective distance measurements. In the described embodiment, each measurement channel comprises a laser emitter and a corresponding light sensor. The laser emitters and sensors may be arranged as described above or in various different ways.

An action 1402 comprises assigning each channel to one of at least two charging banks. In the described embodiment, the channels are divided so that some of the channels belong to the first charging group and some of the channels belong to the second charging group. All the channels of the first charging group are charged concurrently while the channels of the second charging group are being used sequentially for distance measurements. Then all of the channels of the second charging group are charged concurrently while the channels of the first charging group are being sequentially used for distance measurements. This cycle is repeated indefinitely.

An action 1404 comprises configuring each measurement channel as part of either a first ADC group or a second ADC group. In the described embodiment, the channels are divided equally between groups. The first group comprises those channels for which a first ADC is used for digitization of return signals. The second group comprises those channels for which a second ADC is used for digitization of return signals. An example of ADC group configuration is shown in FIG. 11.

An action 1406 comprises selecting a channel order, which is the order or sequence in which the measurement channels will be used to perform distance measurements. The channel order comprises an ordered sequence of the measurement channels, selected to provide as much physical spacing as possible between channels that are used in temporal proximity to each other. More specifically, the ordered sequence is selected to provide as much physical spacing as possible between channels that are used consecutively, such as one immediately after the other.

The channel order is constrained by the assignment of certain channels to certain charging banks and by the configuration of certain channels with certain ADC groups. Specifically, the ordered sequence comprises a repeating cycle of (a) all the channels of the first charging bank, followed by (b) all the channels of the second charging bank. In addition, the channels of the ordered sequence are alternately from the first ADC group and the second ADC group, in order to allow the use of two channels during overlapping time periods.

Action 1408 comprises rotating a chassis that supports the laser emitters and light sensors of the measurement channels. In the described embodiment, the chassis is rotated continuously, at a constant rotational velocity, in multiple rotations. Each rotation scans the laser emitters and the light sensors horizontally over or across a scene. Note that in other embodiments, scanning over a scene can be performed in ways other than rotation.

A set of actions 1410 is performed for each of multiple rotations of the chassis.

An action 1412 comprises selecting a pulse spacing to be used by each channel. In the described embodiment, a pulse spacing is specified as a duration of a time period by which adjacent pulses are spaced. The duration can be selected randomly for each channel, and may be selected anew for every rotation of the chassis. In other embodiments, a spacing duration may be selected for each channel and may be permanently assigned to each channel or assigned according to a defined pulse spacing plan. In yet other embodiments, a single pulse may be used for measurements rather than multiple pulse bursts.

An action 1414 comprises generating reference waveforms for each channel, respectively. A reference waveform for an individual channel may be obtained by emitting a laser burst from the laser emitter of the channel in the direction of a reference surface. For example, the reference surface may be a non-rotating part of a support structure of the chassis. The reflection of the laser burst is sensed by the sensor element of the channel, digitized by the associated ADC, and stored for future use. In some embodiments, multiple measurements may be made in this manner and averaged to create the reference waveform. In some embodiments, the reference waveform for each channel may be re-captured and updated for every rotation of the chassis.

A set of actions 1416 is performed for every measurement channel, in the channel order described above with reference to the action 1406.

An action 1418 comprises emitting a burst of light pulses to perform a distance measurement. Each emitted burst includes a pair of light pulses separated in time by a time interval having a duration. The action 1418 comprises varying the duration of the time interval for different emitted bursts of light pulses, in accordance with the action 1412 described above. In some embodiments, the duration is varied across the different measurement channels, and is varied repeatedly for each measurement channel. More specifically, the duration used in a burst generated by a particular measurement channel is varied for every rotation of the chassis.

In some embodiments, each of the channels may use a different and unique duration for the spacing between burst pulses. In some embodiments, the time interval durations may be selected randomly and assigned to individual channels. In some embodiments, a unique time interval duration may be assigned permanently to each channel.

In the described embodiment, each burst has a maximum expected round-trip propagation time, which is the time required for the burst to propagate to and from a surface at a maximum expected distance. The channels are used in an overlapping and interlaced fashion, so that a first burst is emitted and a second burst is emitted during the round-trip propagation time of the first burst. The channel order ensures that overlapping bursts such as this are associated with different ADCs.

An action 1420 comprises sensing a reflected light burst corresponding to an emitted light burst. This action is performed by the sensor element of the channel corresponding to the laser emitter from which the emitted light burst originated. The action includes digitizing a signal produced by the sensor element to produce a digitized return light signal. The digitizing is performed by the ADC associated with the channel.

An action 1422 comprises determining the propagation or flight time of the emitted burst. In certain embodiments described herein, the action 1422 comprises cross-correlating each emitted burst with a corresponding reflected light burst to determine the propagation time. For example, the action 1422 may comprise calculating, for a particular channel, a cross-correlation between the reference waveform corresponding to the channel and the reflected light signal corresponding to the channel. The action 1422 may further comprise finding the highest peak of the cross-correlation and determining the propagation time based on the time relationship of the highest peak to the reference waveform.

In the environment described herein, any of the actions described above may be performed, controlled, or supervised at least in part by the controller 608 referenced in FIG. 6.

EXAMPLE CLAUSES

A. An example device comprises:
a laser light source configured to emit bursts of light pulses to perform distance measurements, each emitted burst including first and second light pulses separated by a time interval having a duration;
control logic communicatively coupled to the laser light source that varies the duration of the time interval for different emitted bursts;
a light sensor that senses reflected light bursts corresponding respectively to the emitted bursts; and
analysis logic communicatively coupled to the light sensor that analyzes a cross correlation of each emitted burst with a corresponding one of the reflected light bursts to determine a propagation time.

B. An example device according to example A, further comprising:
a chassis for the laser light source, the chassis being rotatable to optically scan the emitted bursts over a scene; and
wherein the control logic is configured to vary the duration of the time interval at least once for every rotation of the chassis.

C. An example device according to example A or example B, further comprising:
an electrical circuit that generates first and second electrical pulses to produce a first emitted burst of light pulses, the electrical circuit comprising an inductor, a first capacitor, and a second capacitor;
the inductor being connected to charge the first and second capacitors in parallel; and
the first and second capacitors being configured to discharge separately to produce the first and second electrical pulses.

D. An example device according to example C, wherein:
the laser light source comprises a laser emitter;
the first capacitor is in series with the laser emitter;
the electrical circuit further comprises a first transistor connected to selectively cause the first capacitor to discharge through the laser emitter;
the second capacitor is connected in series with the laser emitter; and
the electrical circuit further comprises a second transistor connected to selectively cause the second capacitor to discharge through the laser emitter.

E. An example device according to example C or example D, wherein:
the first transistor comprises a first GaN FET (gallium nitride field-effect transistor); and
the second transistor comprises a second GaN FET.

F. An example device comprises:
multiple laser emitters;
multiple light sensors corresponding respectively to the laser emitters;
multiple measurement channels that are used in an ordered sequence to perform distance measurements, each measurement channel comprising one of the laser emitters and a corresponding one of the light sensors, the measurement channels including a first measurement channel and a second measurement channel;
a controller configured to perform actions comprising:
emitting a first burst of light pulses using a first laser emitter of the first measurement channel, the first burst of light pulses including a first set of light pulses that are separated by a first time interval of a first duration;
emitting a second burst of light pulses using a second laser emitter of the second measurement channel, the second burst of light pulses including a second set of light pulses that are separated by a second time interval of a second duration, the second duration being different than the first duration;
determining a first reflected light signal using a first light sensor of the first measurement channel, the first reflected light signal corresponding to the first burst of light pulses;
determining a second reflected light signal using a second light sensor of the second measurement channel the second reflected light signal corresponding to the second burst of light pulses; and
creating a first cross-correlation of the first burst of light pulses with the first reflected light signal;
analyzing the first cross-correlation to determine a first propagation time of the first burst of light pulses;
creating a second cross-correlation of the second burst of light pulses with the second reflected light signal; and
analyzing the second cross-correlation to determine a second propagation time of the second burst of light pulses.

G. An example device according to example F, the actions further comprising:
randomly selecting the first duration; and
randomly selecting the second duration.

H. An example device according to example F or example G, wherein:
the first measurement channel is configured to emit the first burst of light pulses at a first wavelength; and
the second measurement channel is configured to emit the second burst of light pulses at a second wavelength.

I. An example device according to any one of examples F-H, wherein:
the channels include a first group of the channels and a second group of the channels;
the device further comprises a first ADC (analog-to-digital converter) communicatively coupled to the first group of the channels and a second ADC for use with the second group of the channels; and
the channels of the ordered sequence are alternately from the first group and the second group.

J. An example device according to any one of examples F-I, wherein the first burst has a round-trip propagation time, the second burst being emitted during the round-trip flight time of the first burst.

K. An example device according to any one of examples F-J, wherein:
a first charging bank comprising a first set of the channels;
a second charging bank comprising a second set of the channels; and
the ordered sequence comprises a repeating cycle of (a) the channels of the first charging bank, followed by (b) the channels of the second charging bank.

L. An example device according to any one of examples F-K, wherein the ordered sequence is selected to provide at least a minimum physical spacing between the laser emitters of consecutively used channels.

M. An example device according to any one of examples F-L, further comprising:
a chassis that is rotatable to optically scan the emitted bursts in a scan direction, the light sensors being supported by the chassis, the scan direction corresponding to a scan axis relative to which the light sensors are positioned; and the light sensors being arranged in parallel rows, a particular row of the light sensors extending along a line that is angled with respect to the scan axis.

N. An example device according to any one of examples F-M, wherein the laser emitters are arranged in a hexagonal lattice.

O. An example device according to any one of examples F-N, wherein the parallel rows are staggered with respect to the scan axis.

P. An example device according to any one of examples F-O, further comprising:
  a chassis that is rotatable to optically scan the emitted bursts in a scan direction, the light sensors being supported by the chassis, the scan direction corresponding to a scan axis relative to which the light sensors are positioned; and
  the light sensors being arranged in parallel rows, a particular row of the light sensors extending along a line that is angled with respect to the scan axis.

Q. An example device according to any one of examples F-P, wherein the light sensors are arranged in a hexagonal lattice.

R. An example device according to any one of examples F-Q, wherein the parallel rows are staggered relative to the scan axis.

S. An example method comprises:
  emitting bursts of light pulses to perform distance measurements, each emitted burst including a first and second light pulses separated by a time interval having a duration;
  varying the duration of the time interval for different emitted bursts of light pulses;
  sensing reflected light bursts; and cross-correlating each emitted burst with a corresponding one of the reflected light bursts to determine a propagation time.

T. An example method according to example S, further comprising:
  rotating a chassis in repeated rotations to optically scan the emitted bursts over a scene;
  wherein varying the duration comprises changing the duration at least once every rotation of the chassis.

U. An example method according to example S or example T, wherein:
  emitting the bursts of light pulses comprises emitting the bursts from at least first and second laser emitters;
  varying the duration comprises (a) selecting a first duration of the time interval by which light pulses emitted by the first laser emitter are separated and (b) selecting a second duration of the time interval by which light pulses emitted by the second laser emitter are separated;
  wherein the first and second durations are different from each other.

V. An example method according to example S or example U, wherein:
  the method further comprises rotating the first and second laser emitters in repeated rotations to optically scan the emitted bursts over a scene; and
  varying the duration further comprises (a) changing the first duration for every rotation and (b) changing the second duration for every rotation.

W. An example method according to example S or example U, wherein:
  emitting the bursts of light pulses comprises emitting the bursts from multiple laser emitters; and
  varying the duration comprises, for each laser emitter, randomly selecting the duration of the time interval by which light pulses emitted by the laser emitter are separated.

X. An example method according to example S or example U, wherein:
  emitting the bursts of light pulses comprises emitting the bursts from multiple laser emitters;
  the method further comprises rotating the laser emitters in repeated rotations to optically scan the emitted bursts over a scene;
  varying the duration comprises, for each laser emitter and for each rotation of the laser emitter, randomly selecting the duration of the time interval by which light pulses emitted by the laser emitter are separated.

Y. An example method according to example S or example U, wherein:
  emitting the bursts of light pulses comprises emitting the bursts from multiple laser emitters;
  the method further comprises rotating the laser emitters in repeated rotations to optically scan the bursts over a scene; and
  varying the duration comprises, for each rotation of each laser emitter, selecting a new duration of the time interval by which light pulses emitted by the laser emitter are separated.

Z. An example method according to any one of examples S-Y, wherein:
  emitting the bursts of light pulses is performed using an ordered sequence of measurement channels, each measurement channel comprising a laser emitter and a corresponding sensor element, the measurement channels of the ordered sequence being alternately from a first group of measurement channels and a second group of measurement channels; and
  the first group of measurement channels includes measurement channels associated with a first analog-to-digital converter (ADC) and the second group of measurement channels includes measurement channels associated with a second ADC.

AA. An example method according to any one of examples S-Z, wherein emitting the bursts of light pulses comprises:
  emitting a first burst of light pulses from a first laser emitter of a measurement channel associated with the first ADC, the first burst having a round-trip propagation time; and
  emitting a second burst of light pulses from a second laser emitter of a measurement channel associated with the second ADC, the second burst of light pulses being emitted during the round-trip propagation time.

BB. An example method according to any one of examples S-AA, further comprising:
  assigning each measurement channel to one of at least first and second charging banks; and
  the ordered sequence comprising a repeating cycle of (a) the measurement channels of the first charging bank, followed by (b) the measurement channels of the second charging bank.

CC. An example method according to any one of examples Z-BB, wherein the ordered sequence is selected to provide at least a minimum physical spacing between the laser emitters of consecutively used channels.

DD. An example device, comprising:
  a laser light source that produces laser light;
  a light sensor that senses reflected laser light;

a chassis that supports the laser light source and the light sensor, the chassis being rotatable about a rotational axis to scan in a scan direction, the scan direction being orthogonal to the rotational axis;
the laser light source comprising multiple laser emitters that are arranged in parallel staggered rows relative to a first scan axis of the laser light source, the first scan axis corresponding optically to the scan direction;
the light sensor comprising multiple sensor elements that are arranged in parallel staggered rows relative to a second scan axis of the light sensor, the second scan axis corresponding optically to the scan direction;
a particular row of the laser emitters extending along a first line that is at a first angle with respect to the first scan axis; and
a particular row of the sensor elements extending along a second line that is at the first angle with respect to the second scan axis.

EE. An example device according to example DD, wherein the laser light source is configured to emit bursts of light pulses to perform distance measurements, each emitted burst including first and second light pulses separated by a time interval having a duration.

FF. An example device according to example DD or example EE, further comprising control logic communicatively coupled to the laser light source that varies the duration of the time interval for different emitted bursts.

GG. An example device according to any one of examples DD-FF, wherein the light sensor senses reflected light bursts corresponding respectively to the emitted bursts.

HH. An example device according to any one of examples DD-GG, further comprising analysis logic communicatively coupled to the light sensor that analyzes a cross correlation of each emitted burst with a corresponding one of the reflected light bursts to determine a propagation time.

II. An example device according to any one of examples DD-HH, further comprising multiple measurement channels that are used in an ordered sequence to perform distance measurements, each measurement channel comprising one of the laser light sources and a corresponding one of the light sensors.

JJ. An example device according to example II, the measurement channels comprising a first measurement channel and a second measurement channel, the first measurement channel being configured to emit a first burst of light at a first wavelength, the second measurement channel being configured to emit the second burst of light pulses at a second wavelength.

KK. An example device according to example II or example JJ, the device further comprising a first ADC (analog-to-digital converter) communicatively coupled to the first group of the measurement channels and a second ADC for use with the second group of the measurement channels.

LL. An example device according to example KK, the measurement channels of the ordered sequence being alternately from the first group and the second group.

MM. An example device according to any of examples II-LL, wherein the first burst has a round-trip propagation time, the second burst being emitted during the round-trip flight time of the first burst.

NN. An example device according to any of examples DD-MM, wherein:
a first charging bank comprising a first set of the measurement channels;
a second charging bank comprising a second set of the measurement channels; and
the ordered sequence comprises a repeating cycle of (a) the measurement channels of the first charging bank, followed by (b) the measurement channels of the second charging bank.

OO. An example device according to any one of examples DD-NN, wherein the laser emitters are arranged in a hexagonal lattice.

CONCLUSION

Although the discussion above sets forth example implementations of the described techniques, other architectures may be used to implement the described functionality, and are intended to be within the scope of this disclosure. Furthermore, although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:
1. A LIDAR device comprising:
a laser light source comprising a plurality of laser emitters to emit light, the plurality of laser emitters arranged relative to an x-axis and a y-axis, which is perpendicular to the x-axis, the plurality of laser emitters comprising:
a first row of laser emitters disposed in a first line at a first oblique angle relative to the x-axis; and
a second row of laser emitters disposed in a second line parallel to the first line, the second row of laser emitters being staggered relative to the first row of laser emitters; and
a light sensor comprising a plurality of sensor elements, wherein:
at least one laser emitter of the plurality of laser emitters is configured to emit a first burst of pulses to an object; and
at least one corresponding sensor element of the plurality of sensor elements is configured to receive a second burst of pulses reflected from the object, wherein a time relationship between the first burst of pulses and the second burst of pulses is analyzed to determine a distance to the object.

2. The LIDAR device of claim 1, wherein the plurality of sensor elements are arranged relative to the x-axis and the y-axis to sense reflected light, the plurality of sensor elements comprising:
a first row of sensor elements disposed in a third line at a second oblique angle relative to the x-axis; and
a second row of sensor elements disposed in a fourth line parallel to the third line, the second row of sensor elements being staggered relative to the first row of laser emitters.

3. The LIDAR device of claim 2, wherein:
the LIDAR device comprises a rotatable portion to which the laser light source and the light sensor are coupled;
the y-axis is associated with a rotation axis about which the rotatable portion is rotatable; and
the x-axis is associated with a scan axis, substantially perpendicular to the rotation axis, the scan axis being a direction in which light from the plurality of laser emitters is emitted from the LIDAR device.

4. The LIDAR device of claim 2, wherein each sensor element of the plurality of sensor elements is associated with a respective laser emitter of the plurality of laser emitters and is configured to receive reflected light corresponding to light emitted by the respective laser emitter.

5. The LIDAR device of claim 2, wherein:
the first oblique angle results in each sensor element of the plurality of sensor elements having a unique y-axis position; and
the second oblique angle results in each laser emitter of the plurality of laser emitters having a unique y-axis position.

6. The LIDAR device of claim 1, wherein:
the plurality of laser emitters has a first uniform y-axis pitch; and
the plurality of laser emitters comprises 38 laser emitters.

7. The LIDAR device of claim 2, wherein:
the plurality of sensor elements has a second uniform y-axis pitch; and
the plurality of sensor elements comprises 38 sensor elements.

8. The LIDAR device of claim 2, wherein the plurality of sensor elements has a sensor-to-sensor pitch of about 6 millimeters.

9. The LIDAR device of claim 2, wherein a first spacing between individual laser emitters of the plurality of laser emitters is approximately equal to a second spacing between individual sensor elements of the plurality of sensor elements.

10. The LIDAR device of claim 2, wherein the first oblique angle is approximately equal to the second oblique angle.

11. The LIDAR device of claim 1, further comprising a plurality of emitter boards, the first row of laser emitters being mounted along an upper edge of a first emitter board of the plurality of emitter boards, and the second row of laser emitters being mounted along an upper edge of a second emitter board of the plurality of emitter boards.

12. The LIDAR device of claim 11, wherein the upper edge of the first emitter board and the upper edge of the second emitter board are curved, such that the first row of laser emitters and the second row of laser emitters are arranged along a circumference of an imaginary sphere.

13. The LIDAR device of claim 2, further comprising:
control logic communicatively coupled to the laser light source to control firing of the plurality of laser emitters; and
analysis logic communicatively coupled to the light sensor to analyze signals associated with reflected light received by the sensor elements to determine a propagation time to the object in an environment.

14. A LIDAR device comprising:
a laser light source comprising a plurality of laser emitters arranged in multiple parallel emitter rows and packed in a hexagonal lattice, with alternate rows of the multiple parallel emitter rows being staggered in at least one direction relative to one another, wherein the LIDAR device is configured to perform distance measurement using at least the plurality of laser emitters.

15. The LIDAR device of claim 14, further comprising:
a light sensor comprising a plurality of sensor elements arranged in multiple parallel sensor rows, with alternate rows of the multiple parallel sensor rows being staggered in at least one direction relative to one another.

16. The LIDAR device of claim 15, wherein:
the plurality of laser emitters comprises:
a first row of laser emitters disposed in a first line; and
a second row of laser emitters disposed in a second line parallel to the first line; and
the plurality of sensor elements comprises:
a first row of sensor elements disposed in a third line; and
a second row of sensor elements disposed in a fourth line parallel to the third line.

17. The LIDAR device of claim 15, wherein:
the plurality of laser emitters and the plurality of sensor elements are arranged relative to an x-axis and a y-axis, which is perpendicular to the x-axis;
the multiple parallel emitter rows being disposed at a first oblique angle relative to the x-axis; and
the multiple parallel sensor rows being disposed at a second oblique angle relative to the x-axis.

18. The LIDAR device of claim 17, wherein:
each sensor element of the plurality of sensor elements is positioned at a unique y-axis position relative to other sensor elements of the plurality of sensor elements; and
each laser emitter of the plurality of laser emitters is positioned at a unique y-axis position relative to other laser emitters of the plurality of laser emitters.

19. The LIDAR device of claim 17, wherein:
the plurality of laser emitters has a first uniform y-axis pitch; and
the plurality of sensor elements has a second uniform y-axis pitch.

20. The LIDAR device of claim 14, further comprising an emitter board having a curved upper edge, wherein laser emitters of a first row of the multiple parallel emitter rows are mounted to the curved upper edge of the emitter board.

\* \* \* \* \*